(12) United States Patent
Schulein et al.

(10) Patent No.: US 8,160,261 B2
(45) Date of Patent: Apr. 17, 2012

(54) AUDIO MONITORING SYSTEM

(75) Inventors: Robert B. Schulein, Schaumburg, IL (US); Stephen D. Julstrom, Chicago, IL (US); Michael J. Santucci, Oak Park, IL (US)

(73) Assignee: Sensaphonics, Inc., Chicago, IL (US)

( * ) Notice: Subject to any disclaimer, the term of this patent is extended or adjusted under 35 U.S.C. 154(b) by 1156 days.

(21) Appl. No.: 11/334,758

(22) Filed: Jan. 18, 2006

(65) Prior Publication Data

US 2006/0182287 A1 Aug. 17, 2006

Related U.S. Application Data

(60) Provisional application No. 60/593,483, filed on Jan. 18, 2005.

(51) Int. Cl.
*H04R 29/00* (2006.01)

(52) U.S. Cl. ............ 381/56; 381/98; 381/120; 381/119; 381/320

(58) Field of Classification Search .................. 381/380, 381/23.1, 56, 118, 102, 309, 28, 57, 316, 381/317, 318, 320, 321, 71.6, 72, 74, 91, 381/94.2, 94.3, 94.8, 98, 103, 104, 106, 107, 381/120, 122
See application file for complete search history.

(56) References Cited

U.S. PATENT DOCUMENTS

| | | | |
|---|---|---|---|
| 3,969,583 A | 7/1976 | Griese et al. | |
| 3,983,336 A | 9/1976 | Malek et al. | |
| 3,985,960 A | 10/1976 | Wallace, Jr. | |
| 4,170,720 A | 10/1979 | Killion | |
| 4,374,301 A | 2/1983 | Frieder, Jr. | |
| 4,450,930 A | 5/1984 | Killion | |
| 4,716,985 A | 1/1988 | Haertl | |
| 4,860,362 A | 8/1989 | Tweedle | |
| 4,881,123 A * | 11/1989 | Chapple | 381/104 |
| 4,908,868 A * | 3/1990 | McTaggart | 381/59 |
| 5,051,799 A * | 9/1991 | Paul et al. | 375/242 |
| 5,189,704 A | 2/1993 | Krauss | |
| 5,377,273 A * | 12/1994 | Sutton | 381/122 |
| 5,764,778 A | 6/1998 | Zurek | |
| 6,144,747 A | 11/2000 | Scofield et al. | |
| 6,175,633 B1 * | 1/2001 | Morrill et al. | 381/71.6 |
| 6,456,199 B1 * | 9/2002 | Michael | 340/573.1 |
| 6,567,524 B1 | 5/2003 | Svean et al. | |
| 6,661,901 B1 * | 12/2003 | Svean et al. | 381/328 |
| 6,694,034 B2 | 2/2004 | Julstrom et al. | |
| 6,704,423 B2 | 3/2004 | Anderson et al. | |
| 6,728,385 B2 | 4/2004 | Kvaloy et al. | |
| 6,754,359 B1 | 6/2004 | Svean, Jr. | |

(Continued)

FOREIGN PATENT DOCUMENTS

GB 207089 11/1923

OTHER PUBLICATIONS

PHF-23852-000 Datasheet, Sep. 2, 2005, Knowles Electronics, SHT 1.1.*

*Primary Examiner* — Vivian Chin
*Assistant Examiner* — Leshui Zhang
(74) *Attorney, Agent, or Firm* — Bishop & Diehl, Ltd.

(57) ABSTRACT

An earphone monitoring system is disclosed that provides for user information and control regarding ambient and monitored sound levels.

49 Claims, 22 Drawing Sheets

U.S. PATENT DOCUMENTS

| | | |
|---|---|---|
| 6,970,571 B2 * | 11/2005 | Knorr et al. .................... 381/370 |
| 7,006,643 B2 * | 2/2006 | Anderson ..................... 381/120 |
| 7,263,195 B2 * | 8/2007 | Harvey et al. ................. 381/328 |
| 2001/0046304 A1 | 11/2001 | Rast |
| 2004/0136555 A1 | 7/2004 | Enzmann |
| 2004/0165246 A1 | 8/2004 | Carlson et al. |
| 2004/0226079 A1 | 11/2004 | Rainer |
| 2006/0147049 A1 * | 7/2006 | Bayley et al. .................... 381/56 |

* cited by examiner

AUDIO MONITORING SYSTEM

RELATED APPLICATIONS

This application claims the benefit of U.S. Provisonal Patent Application Ser. No. 60/593,483, filed on Jan. 18, 2005, and herein incorporated by reference.

FIELD OF THE INVENTION

The present invention relates to earphone monitoring systems, and in particular, to a system that provides for user information and control regarding ambient and monitored sound levels.

FEDERALLY SPONSORED RESEARCH OR DEVELOPMENT

None.

BACKGROUND OF THE INVENTION

It is common practice in amplified music performance situations for electroacoustical monitoring systems to be used for purposes of providing each performer a means to better hear themselves as well as other members of a group. Such systems are necessary as a result of the high sound levels often produced on stage by performers, sound reinforcement systems, and audiences. A traditional method of providing this monitoring function makes use of stage-mounted loudspeakers to provide selected portions of the performance to individual musicians. Although effective, this method has a tendency to increase stage sound levels even higher, to potentially harmful values. The monitor loudspeaker sound can also combine acoustically with the main sound system output in a detrimental fashon, reducing overall sound quality and increasing the potential for feedback.

Starting in the late 1980's wireless transmission systems in conjunction with miniature in-the-ear earphones began to be used for monitoring purposes. These systems had the benefit of enabling each performer to be provided with a customized sound mix while at the same time eliminating the introduction of additional undesired sound into the performing area. Depending on the ability of the earphone system to seal off the ear from external sounds, an additional user benefit could be derived from the attenuation of ambient stage sound presented to the user's ear. With such sealed earphone monitoring, it became possible for performers to experience improved monitor sound quality while, at the same time, experiencing lower overall sound levels. However, along with such capabilities came several undesired attributes, such as a lack of awareness of desired ambient sounds including audience reaction, a difficulty in communicating with other performers, and an enhanced ability to produce harmful sound levels at the user's eardrum.

It is the purpose of this invention to provide a solution to these problems with an earphone monitoring system that provides for independent control of the ambient and monitoring sound levels, as well as the sound pressure levels experienced by the user, and doing so with high degrees of sound accuracy and user flexibility.

SUMMARY OF THE INVENTION

The present invention is generally directed to an audio monitoring system that provides for independent control of the ambient and monitoring sound levels. According to one aspect of the invention, an audio monitoring system has at least one microphone positioned on or near a user's head for picking up sound as heard in normal listening. Also, at least one earphone is provided for coupling sound to at least one of the user's ears. Further, an amplifier incorporating electrical equalization is provided that couples the microphone output to the earphone for mimicking the tonal balance heard with no earphone in place.

According to another aspect of the invention, the audio monitoring system includes an electrical means of coupling an additional audio signal into the amplifier. In addition, a means of controlling the perceived balance between the audio signal and the ouput from the microphone is provided.

In yet another aspect of the invention, an apparatus provides a mixture of ambient and monitored audible sound within a right and left ear of a user. The apparatus includes a left earphone, a right earphone, electronic circuitry, a left receiver, a right receiver and a user control. The left earphone includes a microphone and is sized to at least partially fit within the left ear canel, the left microphone providing a left electrical output in response to the ambient sound. The right earphone includes a microphone and is sized to at least partially fit within the right ear canal, the micrphone providing a right electrical output in response to the ambient sound. The electronic circuitry comprises a left mixed output responsive to the left electrical output and the monitored audible sound, and a right mixed output responsive to the right electrical output and the monitored audible sound. The left receiver within the left earphone is responsive to the left mixed output. The right receiver within the right earphone is responsive to the right mixed output. The user control provides for simultaneously varying the responsiveness of the electronic circuitry to the microphone left output and right electrical output.

In a further aspect of the invention, a method provides a mixture of ambient and monitored audible sound within a right and left ear canal. The method includes: at least partially placing a left earphone within the left ear canal, the left earphone comprising a microphone providing a left electrical output in response to the ambient sound; at least partially placing a right earphone within the right ear canal, the right earphone comprising a microphone providing a right electrical output in response to the ambient sound; generating a left mixed output responsive to the left electrical output and the monitored audible sound, and a right mixed output responsive to the right electrical output and the monitored audible sound; and, simultaneously varying the left and right electrical outputs.

In still yet another aspect of the invention, an apparatus provides a mixture of ambient and monitored audible sound within an ear canal. The apparatus includes an earphone, electronic circuitry, a single receiver and a user control. The earphone includes a microphone and is sized to at least partially fit within the ear canal; the microphone provides an electrical output in response to the ambient sound. The electronic circuitry includes a mixed output responsive to the microphone electrical output and the monitored audible sound. The single receiver is within the earphone and is responsive to the mixed output. The user control provides for varying the responsiveness of the electronic circuitry to the microphone electrical output.

In a further aspect of the invention, an apparatus provides a mixture of ambient and monitored audible sound within an ear canal. The apparatus includes an earphone, electronic circuitry, a receiver and a user control. The earphone includes a wide dynamic range microphone and is sized to at least partially fit within the ear canal, the microphone providing an electrical output in response to the ambient sound. The electronic circuitry includes a mixed output responsive to the microphone electrical output and the monitored audible sound. The receiver is within the earphone and responsive to the mixed output. Moreover, the responsiveness of the electronic circuitry to the microphone electrical output can be varied with the user control.

In still yet another aspect of the invention, an apparatus provides a mixture of ambient and monitored audible sound within a user's right and left ear canal. The apparatus includes a left earphone, a right earphone, a left microphone preamplifier and a right microphone preamplifier. The left earphone includes a microphone and is sized to at least partially fit within the left ear canal, the microphone providing a left electrical output in response to the ambient sound. The right earphone comprising a microphone and is sized to at least partially fit within the right ear canal, the microphone providing a right electrical output in response to the ambient sound. The left microphone preamplifier and the right microphone preamplifier are associated with the left earphone and right earphone, respectively. Further, the microphones and microphone preamplifiers are capable of undistorted conversion to corresponding electrical signals and sound pressure levels in excess of 120 dB-SPL.

In another embodiment, an apparatus provides ambient audible sound within a right and left ear canal. The apparatus includes a left earphone, a right earphone, a left microphone preamplifier and a right microphone preamplifier. The left earphone includes a microphone and is sized to at least partially fit within the left ear canal, the microphone providing a left electrical output in response to the ambient sound. The right earphone includes a microphone and is sized to at least partially fit within the right ear canal, the microphone providing a right electrical output in response to the ambient sound. The left microphone preamplifier associated with the left earphone has a left microphone preamplifier gain adjustment means. The right microphone preamplifier associated with the right earphone has a right microphone preamplifier gain adjustment means. Further, the gains are presettable to compensate for variations in the sensitivity of their associated microphones.

In a further embodiment, an apparatus provides ambient or monitored audible sound within a right and left ear canal of a user. The apparatus includes left and right receivers and left and right series resistors. The left and right receivers produce sound in the user's left and right ear canals, respectively. The left and right series resistors are located in proximity to the receivers. Further, the resistors are presettable to compensate for variation in the sensitivity of the receivers.

In yet another embodiment, an apparatus provides a mixture of ambient and monitored audible sound within a right and left ear canal of a user. The apparatus includes a left earphone, a right earphone, left and right receivers, ambient equalization, and receiver equalization. The left earphone includes a microphone and is sized to at least partially fit within the left ear canal, the left microphone providing a left electrical output in response to the ambient sound. The right earphone comprising a microphone and is sized to at least partially fit within the right ear canal, the microphone providing a right electrical output in response to the ambient sound. The left and right receiver providing for production of sound in the user's left and right ear canals. The ambient equalization providing compensation for the response of the left and right receivers. Moreover, the ambient equalization and receiver equalization are separable circuit functions.

In a further embodiment, an apparatus provides monitored audible sound within a right and left ear canal of a user. The apparatus includes left and right receivers, equalization, and differential drive circuitry. The left and right receivers provide for producing sound in the user's left and right ear canals, the receivers covering substantially the full audio frequency band. The equalization provides for compensating the response of the receivers. Further, the differential drive circuitry provides for producing the electrical drive signal to the receivers, responding to the equalization.

In yet another embodiment, an apparatus provides a monitored audible sound within a right and left ear canal of a user. The apparatus includes at least one left and at least one right receiver and an amplification means. The receivers provide for producing sound in the left and right ear canals. The amplification means has a gain to receiver left and right input signals and applies amplified versions to the at least one left and at least one right receiver. Furthermore, the gain is presettable to compensate for the number of the left and right receivers employed to maintain substantially constant electroacoustic gain that is substantially independent of the number of receivers employed.

In still yet another embodiment, an apparatus provides ambient audible sound within a right and left ear canal of a user. The apparatus includes left and right earphones and left and right ambience EQ/limiter circuitry. The left earphone includes a microphone and is sized to at least partially fit within the left ear canal, the left microphone provides a left electrical output in response to the ambient sound. The right earphone includes a microphone and is sized to at least partially fit within the right ear canal, the microphone provides a right electrical output in response to the ambient sound. The left and right ambience EQ/limiter circuitry compensates for the difference in response to ambient sounds as responded to by the left and right earphone microphones and the response near the eardrum of a left or right open ear of the user, and reduces its gain in response to excessive signal levels. The gain is reduced more in the frequency ranges initially having the most ambience EQ/limiter circuitry gain.

In another embodiment, an apparatus provides monitored audible sound within a right and left ear canal of a user. The apparatus includes left and right receivers, receiver equalization and left and right monitor EQ/limiter circuitry. The left and right receivers provide for producing sound in the left and right ear canals. The receiver equalization compensates for the response of the left or right receivers. The left and right monitor EQ/limiter circuitry compensates for the difference in response to monitored sounds as produced by the equalized left or right receivers at the user's eardrums and a desired response, and reduces its gain in response to excessive signal levels. Moreover, the gain is reduced most responsively in the frequency ranges initially having the most monitor EQ/limiter circuitry gain.

In a further embodiment, an apparatus provides audible sound within a right and left ear canal of a user. The apparatus includes left and right receivers for producing sound in the left and right ear canals. Further, at least one indicator is provided that is responsive to an estimation of average sound pressure levels occurring at the eardrums within the left and right ear canals.

In an additional embodiment, an apparatus provides a mixture of ambient and monitored audible sound within a right and left ear canal of a user. The apparatus includes a left earphone, a right earphone, left and right receivers, ambient equalization and receiver equalization. The left earphone includes a microphone and is sized to at least partially fit within the left ear canal, the left microphone provides a left electrical output in response to the ambient sound. The right earphone includes a microphone and is sized to at least partially fit within the right ear canal, the right microphone provides a right electrical output in response to the ambient sound. The left and right receivers produce sound in the user's left and right ear canals. The ambient equalization compensates for the difference in response to ambient sounds as responded to by the left or right earphone microphone and the response near the eardrum of a left or right open ear. The receiver equalization compensates for the response of the left or right receiver. Further, at least a portion of the ambient equalization and at least a portion of the receiver equalization are combined into common circuit functions.

In another embodiment, an apparatus provides ambient audible sound within a right and left ear canal of a user. The apparatus includes a left earphone, a right earphone, and left and right ambience limiter circuitry. The left earphone includes a microphone and is sized to at least partially fit within the left ear canal, the left microphone providing a left electrical output in response to the ambient sound. The right earphone includes a microphone and is sized to at least partially fit within the right ear canal, the right microphone providing a right electrical output in response to the ambient sound. Further, the left and right ambience limiter circuitry reduces its gain in response to excessive signal levels.

In yet another embodiment, an apparatus provides monitored audible sound within a right and left ear canal of a user. The apparatus includes left and right receivers, receiver equalization, and left and right EQ/limiter circuitry. The left and right receivers produce sound in the user's left and right ear canals. The receiver equalization compensates for the response of the left or right receiver. The left and right monitor EQ/limiter circuitry compensates for the difference to monitored sounds, as produced by the equalized left or right receivers at the user's eardrums, and a desired response. The left and right monitor EQ/limiter circuitry also reduces its gain in response to excessive signal levels. Further, the gain is reduced more in the frequency ranges initially having greatest monitor EQ/limiter circuitry gain. Moreover, the gain reduction occurs when the average signal levels exceed a threshold.

In still another embodiment, an apparatus provides monitored audible sound within a right and left ear canal of a user. The apparatus includes left and right receivers, receiver equalization, and left and right EQ/limiter circuitry. The left and right receivers produce sound in the user's left and right ear canals. The receiver equalization compensates for the response of the left or right receiver. The left and right monitor EQ/limiter circuitry compensates for the difference to monitored sounds, as produced by the equalized left or right receivers at the user's eardrums, and a desired response. The left and right monitor EQ/limiter circuitry also reduces its gain in response to excessive signal levels. Further, the gain is reduced more in the frequency ranges initially having the most monitor EQ/limiter circuitry gain. Moreover, the gain reduction occurs in response to average signal levels predictive of the approximate sound pressure levels occurring at a user's left and right eardrums. Also, the gain reduction occurs when the average signal levels exceed a threshold. In addition, the threshold can be varied in conjunction with user control of the responsiveness of the electronic circuitry to the microphone outputs.

In an additional embodiment, an apparatus provides monitored audible sound within a right and left ear canal of a user. The apparatus includes left and right receivers, receiver equalization, and left and right monitor limiter circuitry. The left and right receivers produce sound in the user's left and right ear canals. The receiver equalization compensates for the response of the left or right receiver. The left and right monitor limiter circuitry reduces its gain in response to excessive signal levels. Further, the gain is reduced more in the frequency ranges initially having the most monitor limiter circuitry gain.

Other embodiments, systems, methods, features, and advantages of the present invention will be, or will become, apparent to one having ordinary skill in the art upon examination of the following drawings and detailed description. It is intended that all such additional systems, methods, features, and advantages included within this description be within the scope of the present invention, and be protected by the accompanying claims.

DESCRIPTION OF THE DRAWINGS

The invention may be better understood with reference to the following drawings. The components in the drawings are not necessarily to scale, emphasis instead being placed upon illustrating the principles of the invention. In the drawings, like reference numerals designate corresponding parts throughout the several views.

FIG. 2c illustrates internal and external user controls and information displays provided on the ambient body pack of FIG. 2a;

DESCRIPTION OF DETAILED EMBODIMENTS

The following descriptions of detailed embodiments are for exemplifying the principles and advantages of the inventions claimed herein. They are not to be taken in any way as limitations on the scope of the inventions.

Figure 1:
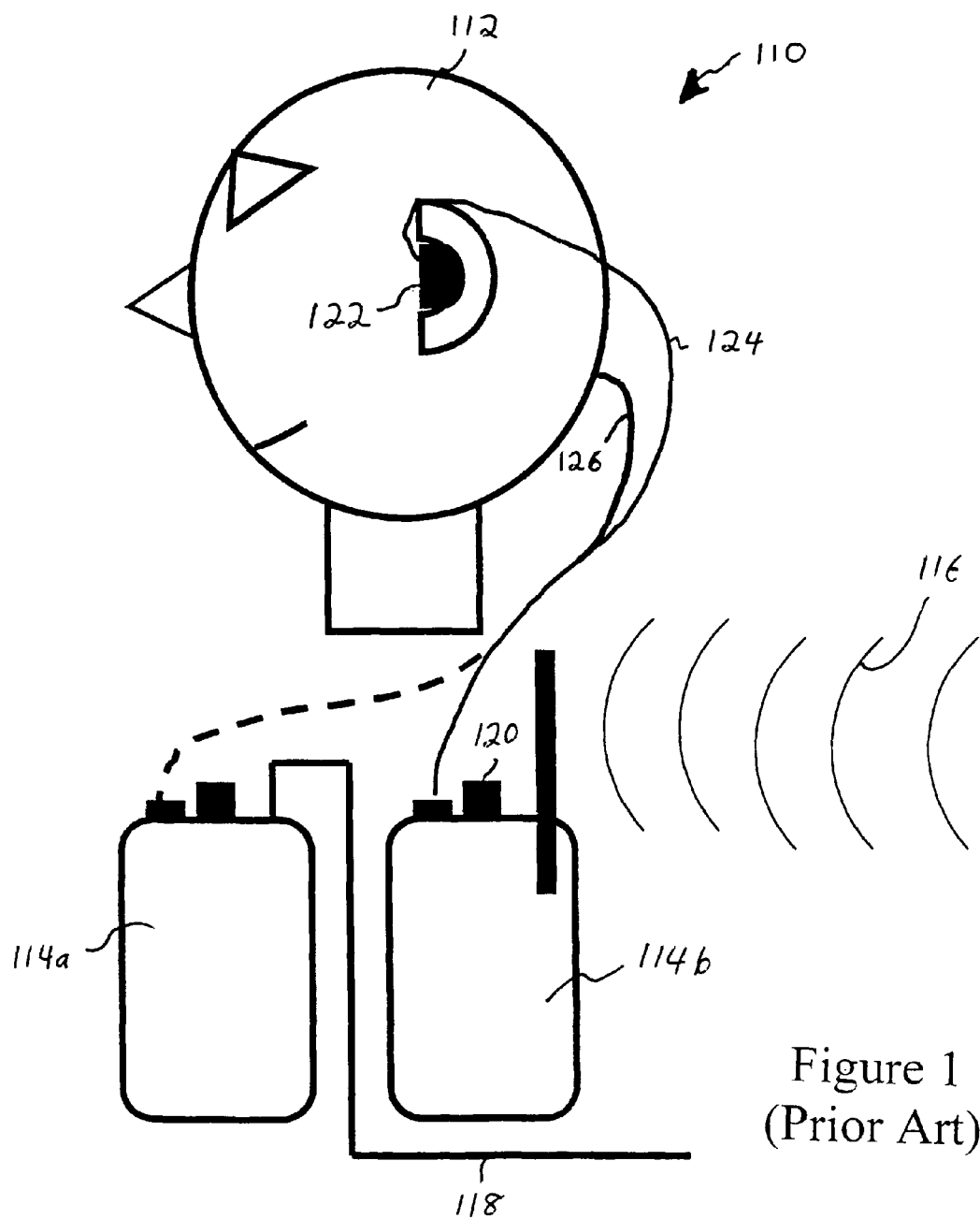
FIG. 1 (Prior Art) is a simplified diagram of the basic elements of an earphone monitoring system.

Turning to FIG. 1, the basic elements of an earphone monitoring system 110 as presently commercially available is shown. In the system, the user 112 wears a monitoring body pack 114a or 114b that receives a personalized mix of the performer's instrumental and vocal sounds either by radio frequency transmission 116 (i.e., body pack 114b) or by direct electrical connection 118 (i.e., body pack 114a). These monitoring body packs can be purchased from Shure Incorporated, Niles, Ill., under part numbers P6HW (wired) or P6R (wireless), or from Sennheiser Electronic Corporation, Old Lyme, Conn., under part number EK3053-U (wireless), for example.

The monitoring body pack 114 has a user monitor level control 120 that controls the gain of the received monitor signal that is applied to the output signal of monitoring body pack 114 appearing at earphone assembly 122 (only one earphone shown). This signal actually contains two signals, a left monitoring body pack output signal 124 and a right monitoring body pack output signal 126, for application to the left earphone and the right earphone, respectively, of the earphone assembly 122. These two signals are often identical, but may also consist of two different sound mixes.

Figure 2A:
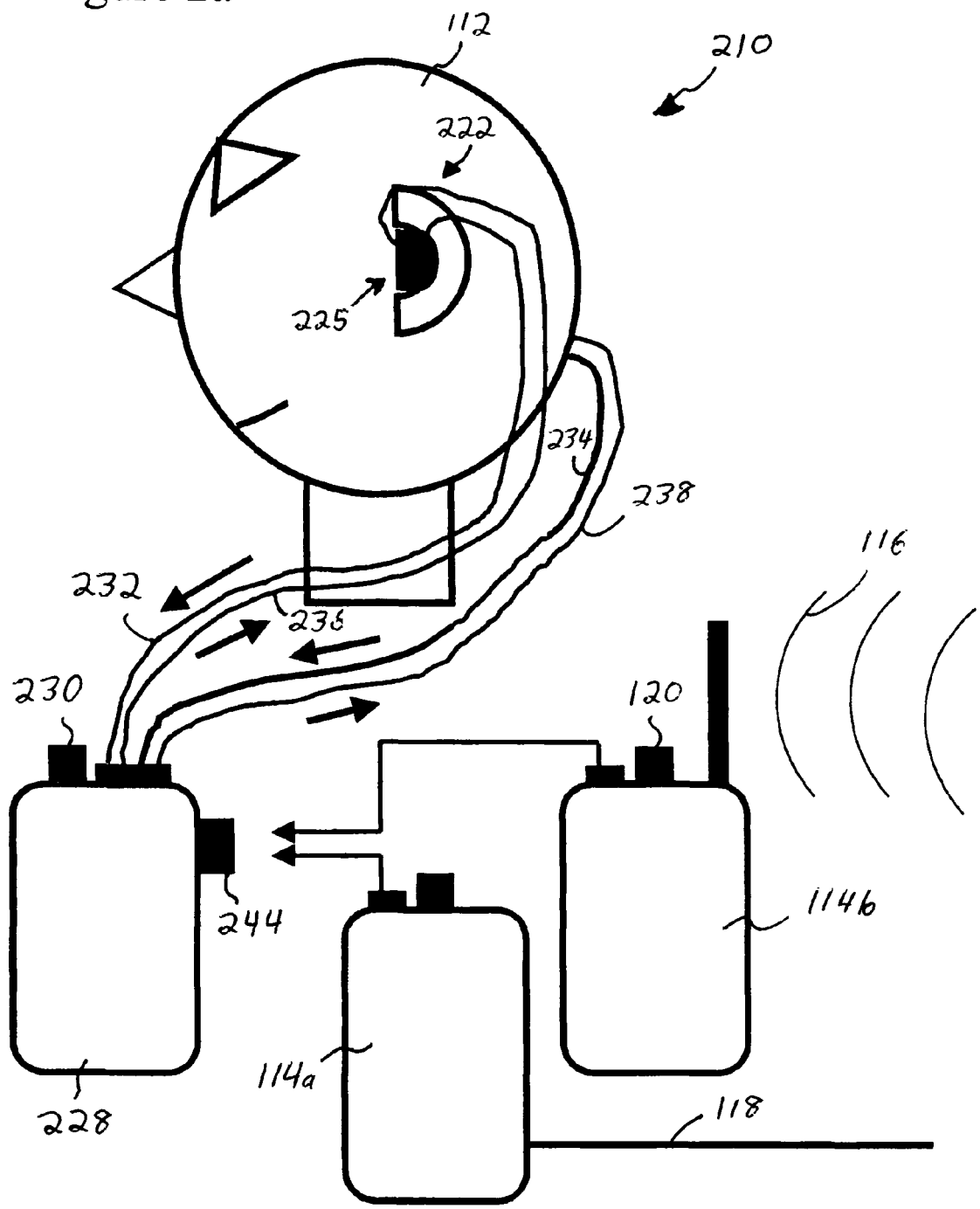
FIG. 2a is a simplified diagram of various elements of earphone monitoring system embodiments in accordance with the present invention.

Embodiments of an earphone monitoring system 210 in accordance with the present invention are shown in FIG. 2a. Interposed between a monitoring body pack 114a or 114b and left earphone 225 and right earphone (not shown) of earphone assembly 222 is ambient body pack 228, including ambient level control 230. Left monitoring body pack output signal 232 and right monitoring body pack output signal 234 from earphone assembly 222 are sent to the ambient body pack 228 for re-amplification. The left 236 and right 238 output signals of ambient body pack 228 can contain, among other things, these re-amplified monitoring signals. The ambient body pack output signals 236,238 are applied to left earphone and right earphone, respectively, of the earphone assembly 222 (only one earphone shown).

The earphone assembly 222 includes, among other things described herein, a left earphone 225 and a right earphone (not shown). The left earphone 225 includes a left receiver, a left microphone and a left microphone preamplifier, as described in detail further herein. Likewise, the right earphone includes a right receiver, a right microphone and a right microphone preamplifier, as described in detail further herein.

Accordingly, left microphone receives acoustic input from sounds appearing generally on the left side of the user's head 112, while the right microphone receives acoustic input from sounds appearing generally on the right side of the user's head 112. The output signals of the left and right microphones are buffered by their respective microphone preamplifiers. The outputs 232,234 of the left and right microphone preamplifiers are sent to the ambient body pack 228, where their level is controlled by ambient level control 230, before being mixed with the left and right monitor signals received at ambient body pack monitor input 244 and eventual amplified return to left and right earphones, respectively.

Figure 2B:
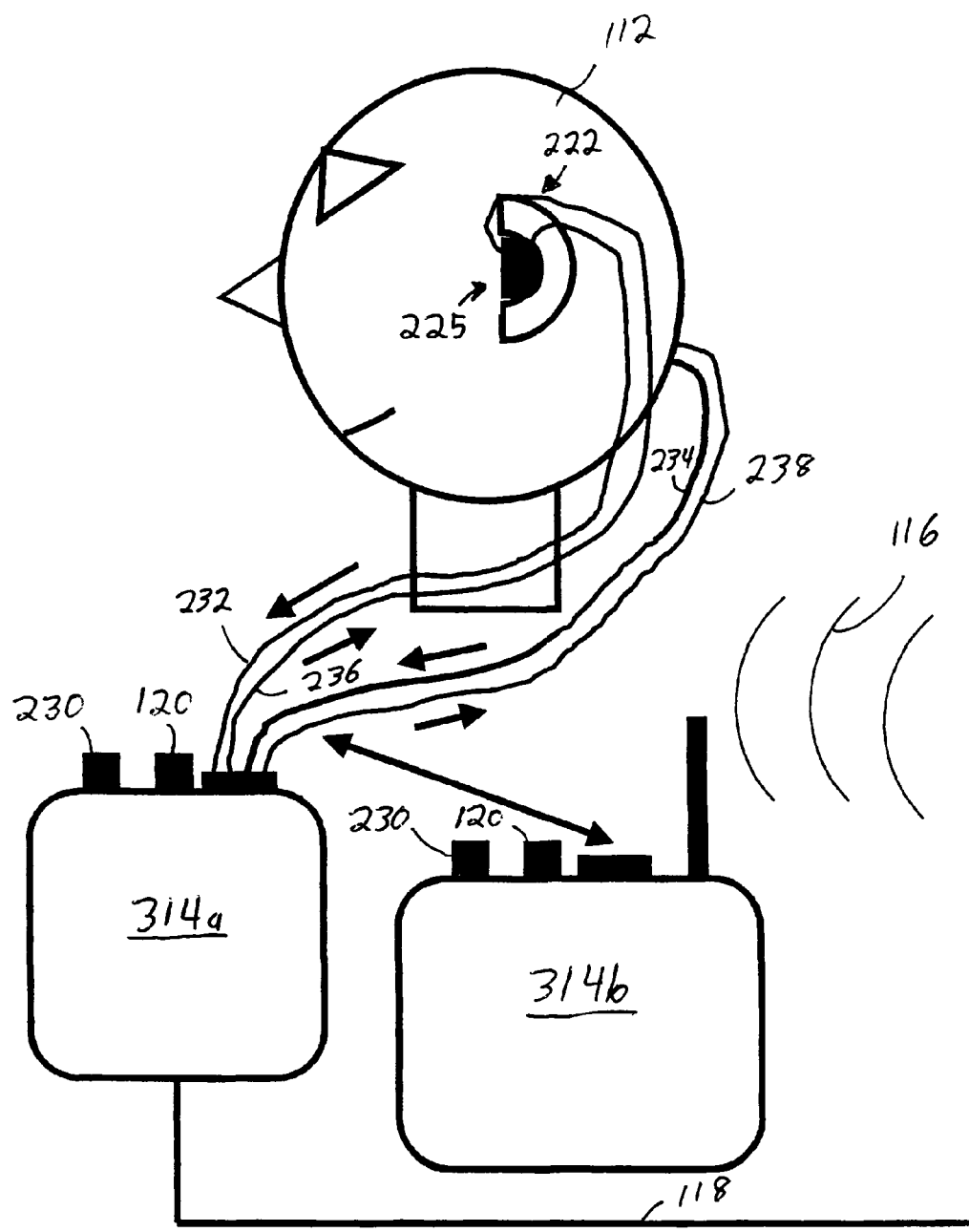
FIG. 2b is a simplified diagram depicting the ambient and monitoring body pack combined within a single package.

As shown in FIG. 2b, the just-described ambient and monitoring body pack functionality can be combined into a single ambient-monitoring body pack that includes both ambient level control 230 and monitor level control 120. Moreover, the single ambient-monitoring body pack can be wired 314a, wireless 314b, or both wired and wireless.

Figure 2C:
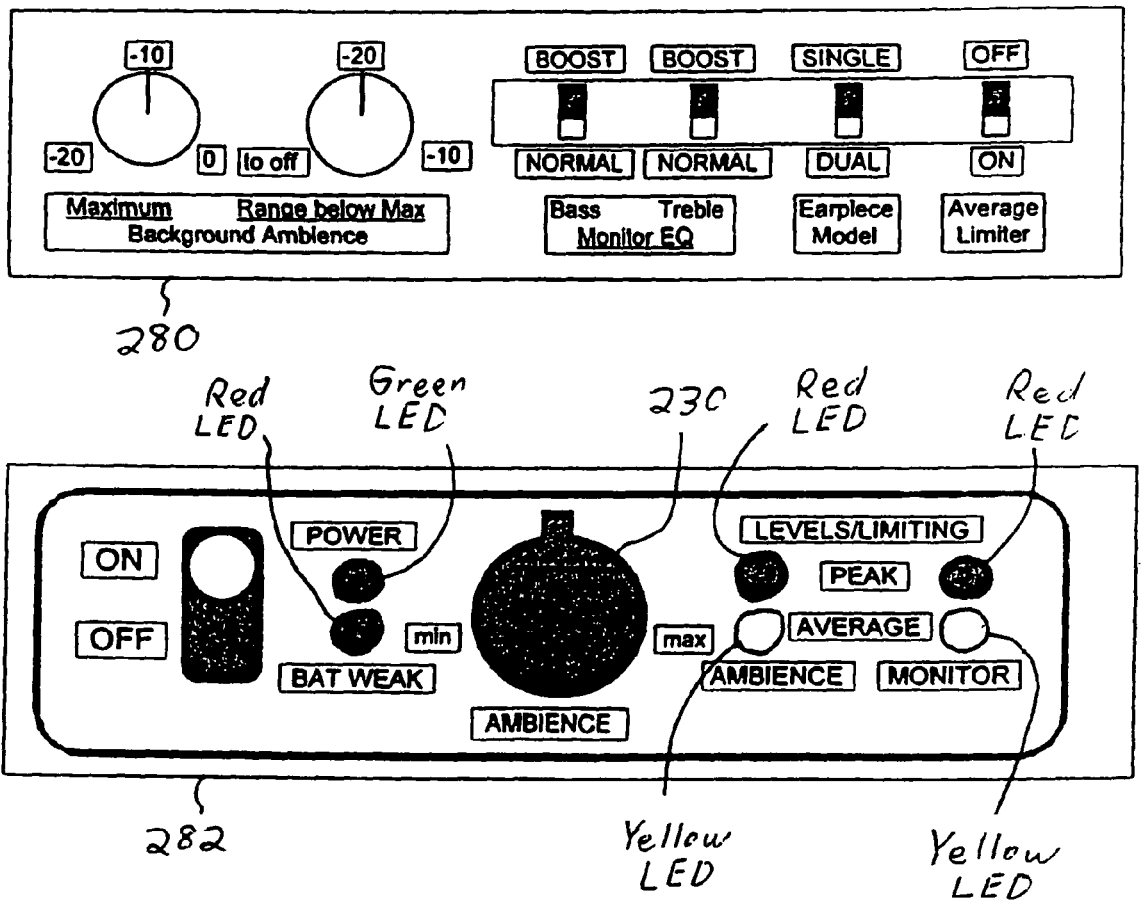

FIG. 2c illustrates internal and external user controls and information displays that can be provided on the ambient body pack. In an embodiment, the controls on panel 280 can be provided within the battery compartment of the body pack. Also, the controls and information displays on panel 282 can be provided on the top of the body pack.

Preferably, but not necessarily, the body pack is attached to the user. Accordingly, the user has personal and convenient access to the external user controls and information displays.

Figure 3:
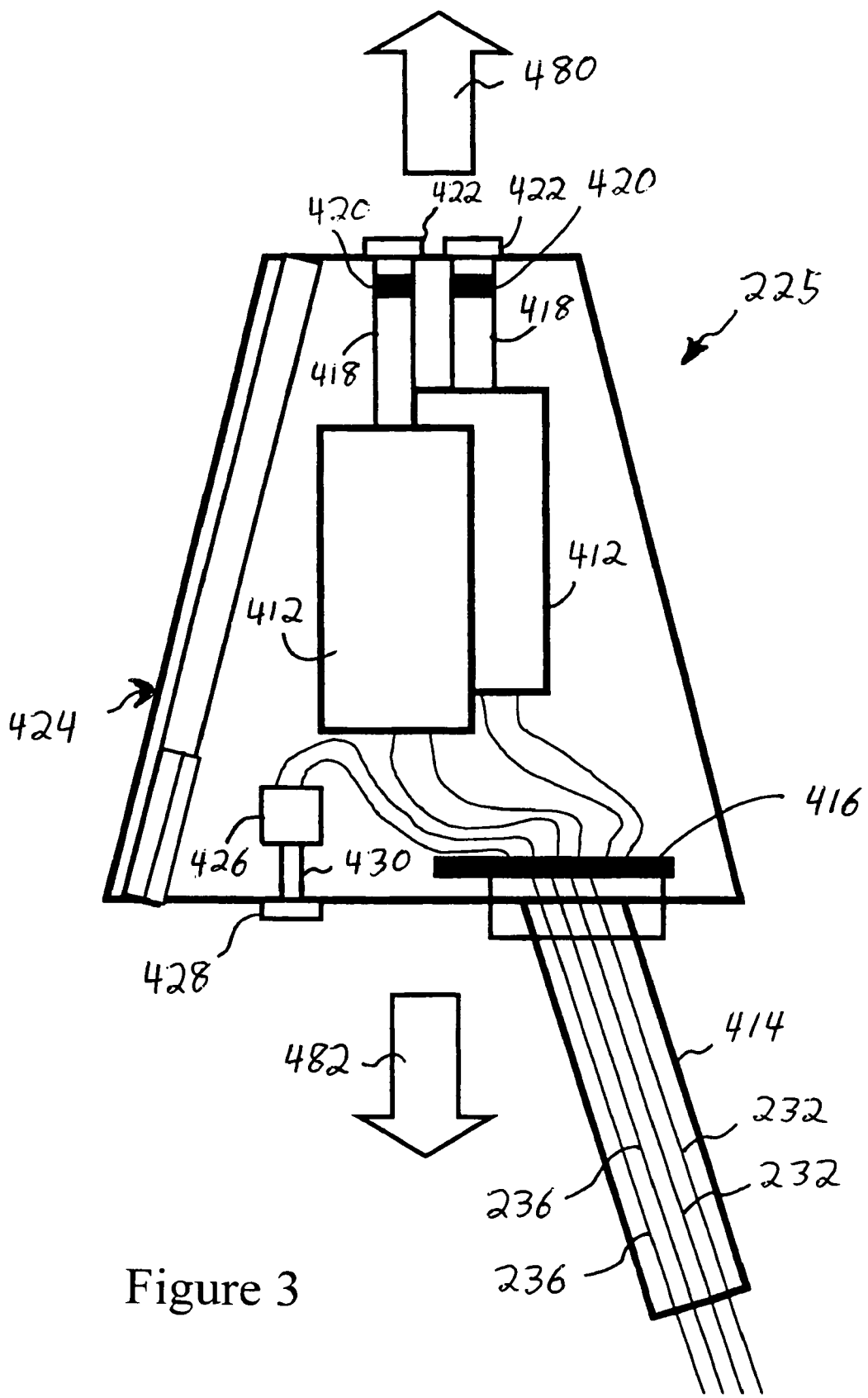
FIG. 3 is a simplified diagram depicting the internal components of the left earphone shown in FIG. 2a, wherein the right earphone (not shown in FIG. 2a) is a mirror image of the left earphone.

FIG. 3 shows the internal components of the left earphone 225 depicted in FIG. 2a wherein, when the earphone is inserted in the user's ear, arrow 480 is within the user's ear canal and arrow 482 is outside of the user's ear (i.e., ambient sound area). Only one earphone is depicted in detail because, preferably, the left and right ear earphones are substantially identical. In an embodiment, the outer surface of the earphone is made of a conventional silicone compound or the like wherein, desirably, but not necessarily, the earphone seals the ear canal.

In an embodiment, the earphone contains either one or two earphone receivers 412, which can be Knowles Acoustics PHF3852, for receiving ambient body pack output signal 236 through cable 414 and earphone circuit board 416. Two receivers may be employed instead of one to increase the maximum sound pressure level obtainable by 6 dB. As will be appreciated by those having ordinary skill in the art, one PHF 3852 receiver can produce an ear canal pressure of 124 dB-SPL in the 100 Hz to 800 Hz range, while two can produce 130 dB-SPL. These high levels can be useful for realistic reproduction of short duration transients, but are not advisable for longer duration sounds. Each receiver 412 couples acoustically to the user's ear canal volume through a tube 418 and an acoustic damper 420, typically of value 2200 Ohms (Knowles Acoustics BF1921). Each damper 420 reduces the effects of acoustic resonances relating to tube 418 and the primary mechanical resonance associated with the moving parts of receiver 412, thus smoothing the net electroacoustic frequency response of the earphone. Conventional receiver wax protection elements 422 prevent ear wax from entering tube 418 and damaging damper 420, receiver 412, or clogging tube 418.

Conventional barometric leak 424 provides a path for equalization of the average air pressure between the ear canal volume and the outside ambient pressure, to increase user comfort. The acoustic resistance of barometric leak 424 is preferably very high so that it has no significant effect within the audio frequency range.

Microphone 426 (advantageously a modified Knowles Acoustics EK-3133 as described in detail further herein) receives acoustic input from ambient environment through conventional microphone protection element 428 and microphone tubing 430. Microphone protection element 428 protects microphone tubing 430 and microphone 426 from dirt, sweat and moisture. In an embodiment, the protection element 428 can conventional or of the type described in U.S. patent application Ser. No. 10/866,233 entitled Acoustically Transparent Debris Barrier For Audio Transducers, filed Jun. 10, 2004, and incorporated herein by reference.

The output signal of microphone 426 is preferably sent to earphone circuit board 416 for pre-amplification buffering before being output along cable 414 to ambient body pack 228 via differential signal path 232.

Figure 4:
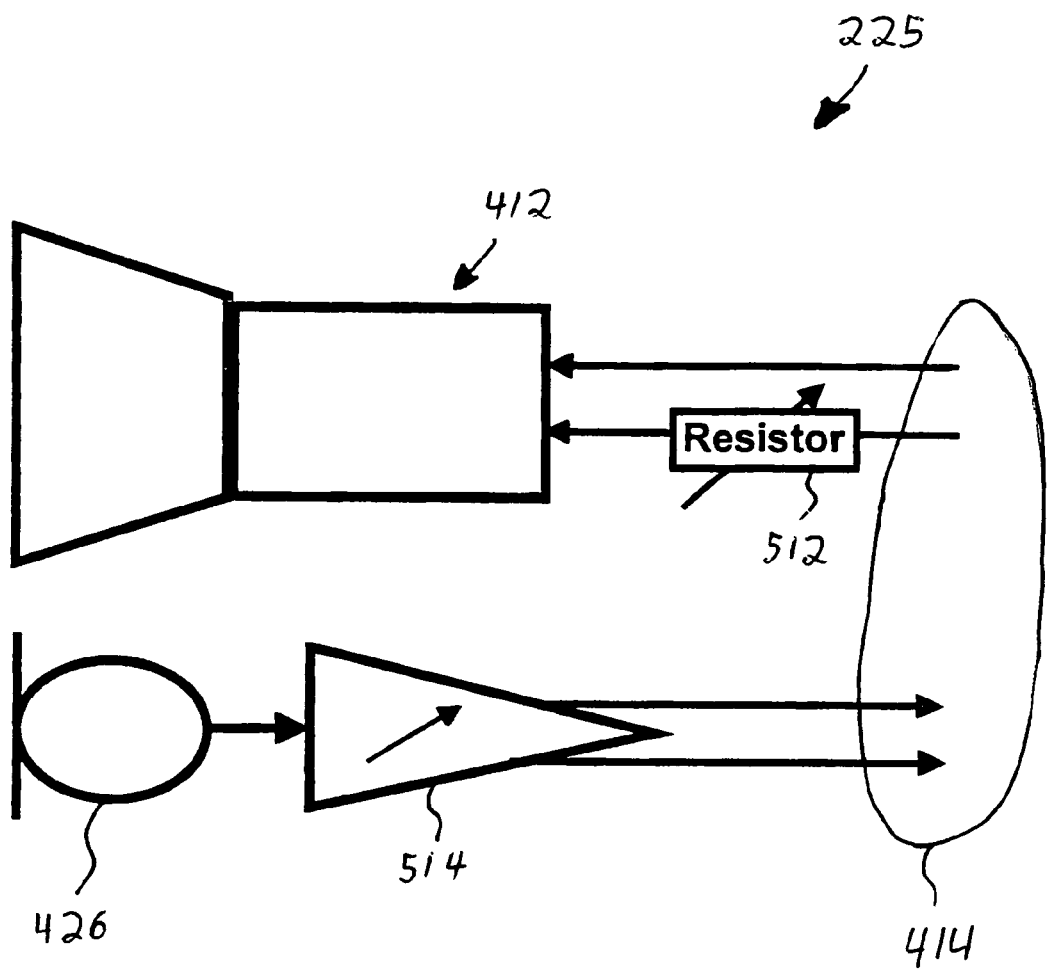
FIG. 4 depicts the electroacoustic elements of the earphone of FIG. 3 in simplified block diagram form.

FIG. 4 shows the electroacoustic elements of an earphone in simplified block diagram form. Two wires of cable 414 feed receiver 412 through production-selectable resistor 512, described in connection with FIG. 5. Moreover, two wires of cable 414 take the signal from production gain-selectable microphone preamplifier 514, which receives its signal from microphone 426.

Figure 5:
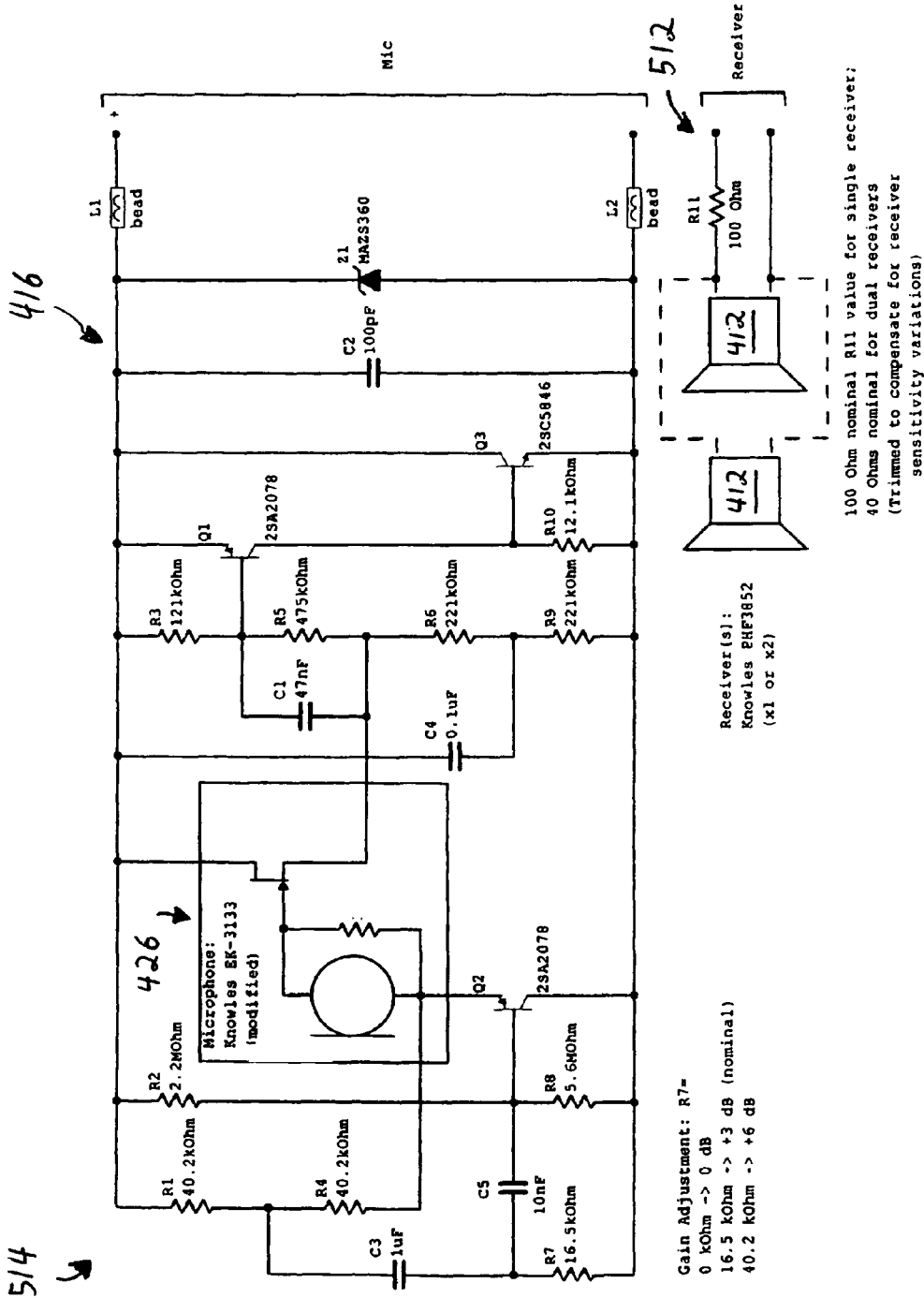
FIG. 5 further depicts, at a simplified schematic level, the earphone circuit board and electroacoustic transducers shown in FIG. 3.

A simplified schematic of an earphone circuit board 416, among other things, is shown in FIG. 5. As known by those having ordinary skill in the art, on-stage ambient sound level for some performers (e.g., rock musicians) can easily reach peak levels in excess of 140 dB-SPL. Microphone 426 and microphone preamplifier 514 must be capable of handling these levels without distortion, so that they may be reproduced by the ambient monitoring system at reduced, safer levels. These acoustic levels produce peak voltage outputs from microphone 426 of greater than + and −10 volts. In addition, it is necessary to take into account production variations of up to about + or −3 dB in the electroacoustic sensitivity of microphone 426, which should be adjusted out by varying the gain of microphone preamplifier 514 so that each produced unit behaves the same and that each left earphone matches each right earphone. This is especially important in the reproduction of ambient sounds so that ambient imaging remains properly balanced. The gain of microphone preamplifier 514 may be varied in production over a range of 0 to +6 dB by selecting resistor R7 to be of the appropriate value from 0 kOhm (0 dB) to 40.2 kOhms (+6 dB), with a nominal value of 16.5 kOhms (+3 dB), as shown.

Microphone preamplifier 514 is designed to handle output signals of greater than + and −14 volts peak. This is accomplished by the circuitry shown, which incorporates microphone 426 with the internal elements approximately as shown. The standard Knowles EK-3133 microphone has approximately these internal elements, but also includes a 22 kOhm FET source load resistor. The desired wide dynamic range is more readily obtained in conjunction with circuitry of the general nature shown and at lower overall circuitry current drain, however, if the standard microphone is modified so as to not include the standard source load resistor. With the modified microphone and the circuitry of FIG. 5, the desired dynamic range is achieved with powering from a low 1.0 mA constant current source from high voltage supplies of +12.5 volts and −21.5 volts, to be discussed in connection with FIG. 6. Microphone preamplifier 514 provides balanced, differential outputs, with a differential output impedance of only 5 Ohms. When feeding the balanced differential input of FIG. 6, this provides for excellent rejection of possible hum and noise pickup by cable 414, allowing the microphone signal wires of cable 414 to be unshielded. This allows for cable 414, which extends from the earphone assembly 222 (FIG. 2a) to the ambient body pack 228 (FIG. 2a) to be simpler, smaller, and lighter.

FIG. 5 also shows resistor 512 (i.e., R11) in series with receiver or receivers 412. The value of this resistor is much larger than the DC resistance of receiver 412 and comparable to the magnitude of its inductance over most of the frequency range. Resistor 512 can then provide a more frequency independent current drive to receiver 412, reducing the difference in receiver sensitivity between low and high frequencies and reducing the amount of equalization needed to flatten the receiver frequency response. Resistor 512 can also be adjusted in production to compensate for variations in receiver sensitivity over most of the frequency range.

Figure 6:
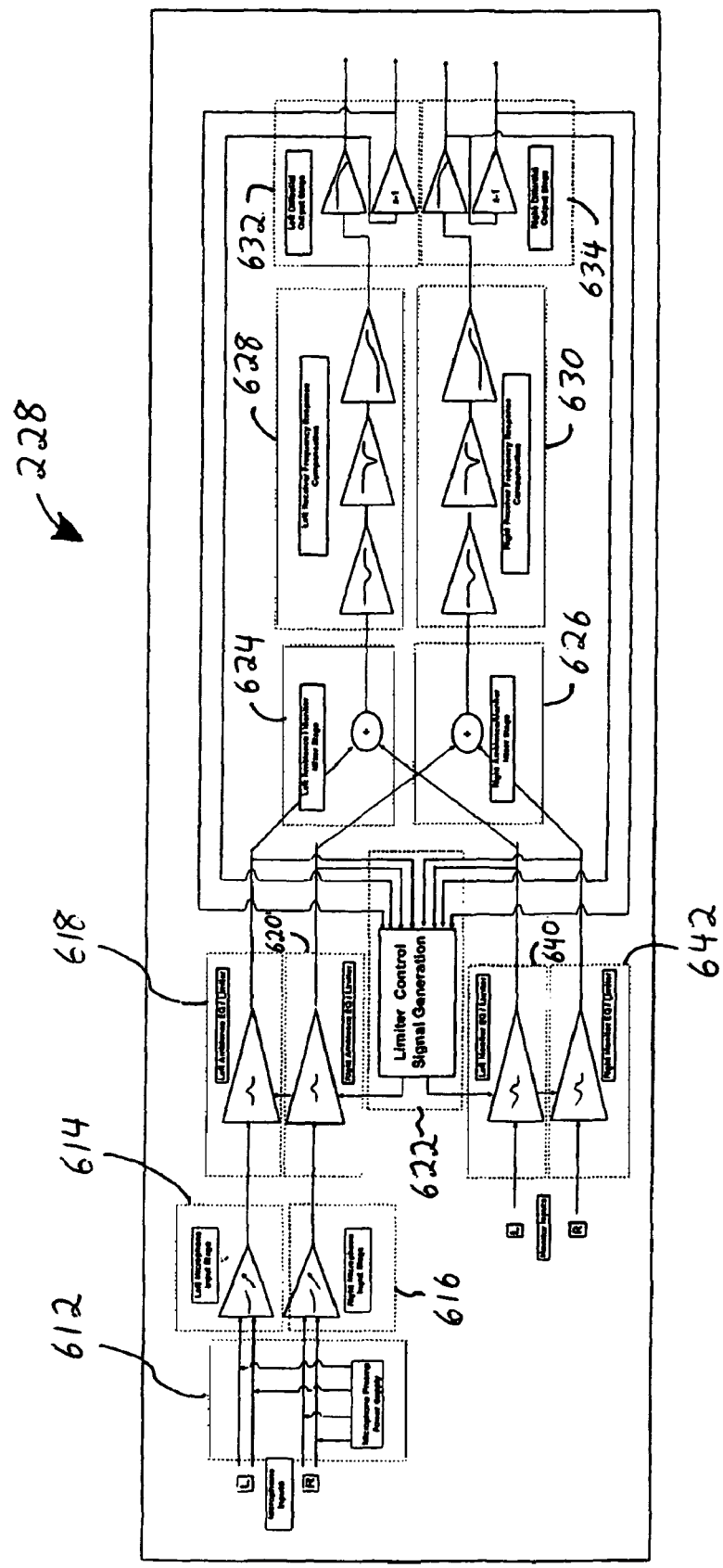
FIG. 6 is a schematic diagram of the ambient body pack of FIG. 2b.

A simplified block diagram of the ambient body pack 228 of FIG. 2a is shown in FIG. 6. The microphone preamplifiers are powered by microphone preamplifier power supply 612, which produces the above described high voltage, constant current powering from a 9 volt battery power source. Left and right microphone input stages 614 and 616 provide a balanced, differential input for the microphone signals, boost the high frequencies to compensate for high frequency roll off of the microphone response due to tubing effects, and provide for gain control of the ambience signal fed back to the earphones, up to a maximum net acoustic gain of unity, that is, the same level that would be present at the ear without the ambience monitoring system present.

The left and right ambience EQ/Limiter stages 618 and 620 receive their inputs from their respective microphone input stages. They provide frequency response shaping in accordance with that needed to compensate for the loss of the open ear's ear canal and concha resonances when the sound destined for the eardrum is picked up in front of a blocked canal and filled concha, rather than at the eardrum end of an open canal. Both the left and right channels have their gains reduced together in response to input from limiter control signal generation block 622. Similarly, left and right monitor EQ/Limiter stages 640 and 642 receive their inputs from the monitor input of ambient body pack 228. They provide similar frequency response shaping as the corresponding ambience signal path blocks just discussed, but with some added low frequency boost for improved subjective results in the monitoring application. They also accept a limiter control signal from the limiter control signal generation block. The ambience and monitor signal paths are independently limited to avoid undesired interaction.

The left and right ambience/monitor mixer stages 624 and 626 combine the left and right signals from the ambience microphone and monitor input signal paths. The gain is preset by the user for either 0 dB or +6 dB for either a dual receiver or a single receiver, respectively, earphone, so that that net electroacoustic gain remains the same in either case.

Left and right receiver frequency response compensation stages 628 and 630 provide equalization to flatten the electroacoustic frequency response as measured from the mixer stages to a typical user's eardrum. The net electroacoustic frequency response from the ambience microphone acoustic inputs and monitor input through to the user's eardrum then is the frequency response of the respective EQ/limiter stages 618, 620, 640, and 642. These are the appropriate frequency responses for acoustic transparency in the case of the ambience signal path, and transparency with a modest low frequency boost in the case of the monitor signal path.

Left and right differential output stages 632 and 634 provide for a wide maximum voltage swing of about 8 volts peak, to maintain high frequency overload capability in the higher frequencies where significant boost is required to maintain response. This allows for a single receiver to be used throughout the frequency range, in contrast to the prior art approach of extending high frequency response by crossing over to a second, lower impedance receiver dedicated to the high frequency range.

The use of balanced, differential signal connections for both the receivers and the microphones prevents significant signal coupling from receiver drive to microphone input from occurring in cable 414. This again enables unshielded wiring to be used, saving complexity, weight, and size.

Figure 7:
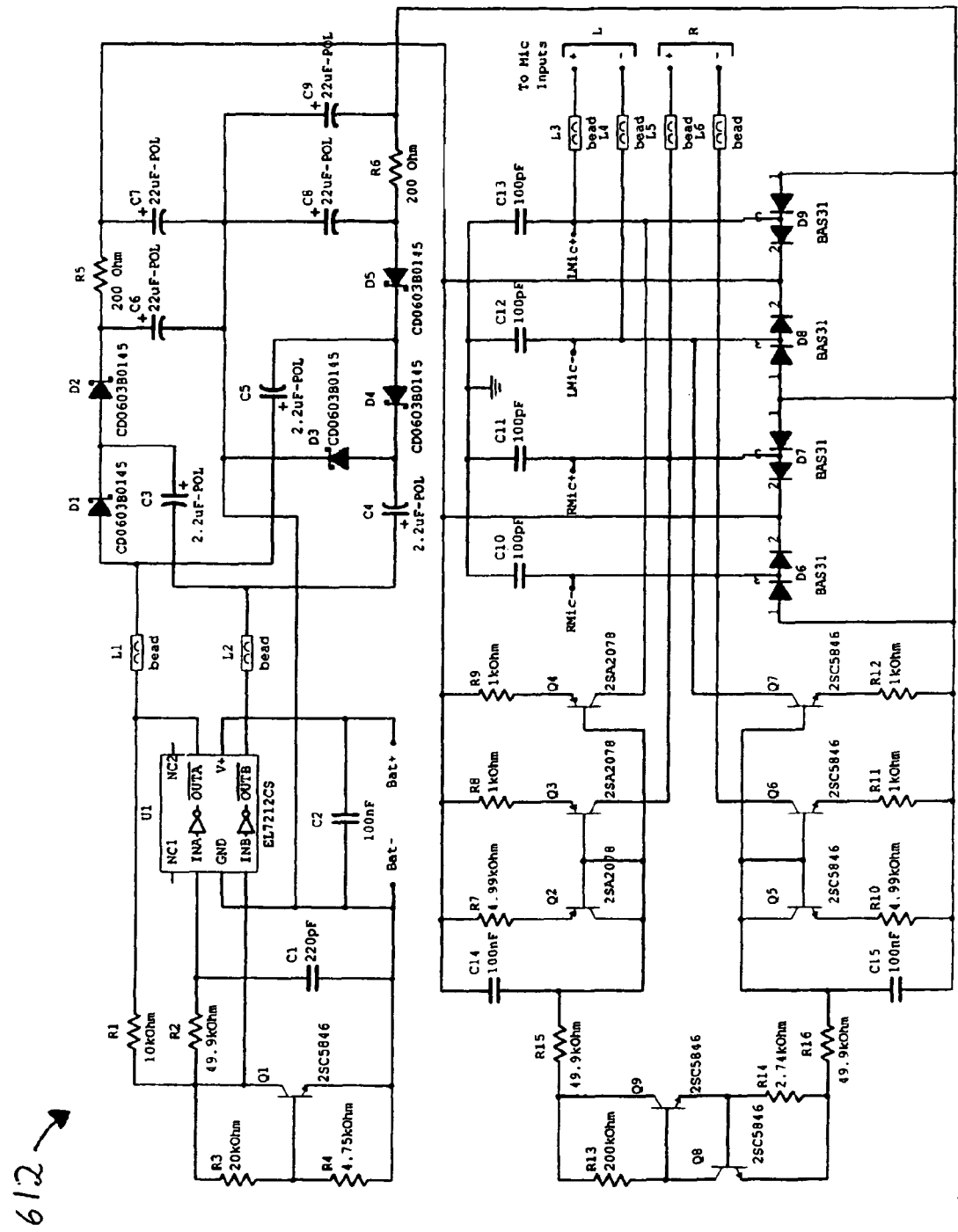
FIG. 7 is a detailed schematic of the microphone preamplifier power supply of FIG. 6.

FIG. 7 is a schematic diagram of the microphone preamplifier power supply 612 of FIG. 6. Voltages of + and −17 volts are generated with respect to a 9 volt battery supply −, which is 4.5 volts below a generated supply-split ground. The voltages are generated by a voltage doubler and a voltage tripler from a 225 kHz biphase square wave oscillator consisting of U1 and associated components. The remaining transistors and associated components provide constant current 1.0 mA supplies to each microphone preamplifier from the generated high voltages. The remaining diodes, capacitors, and ferrite beads provide input protection and RF filtering.

Figure 8:
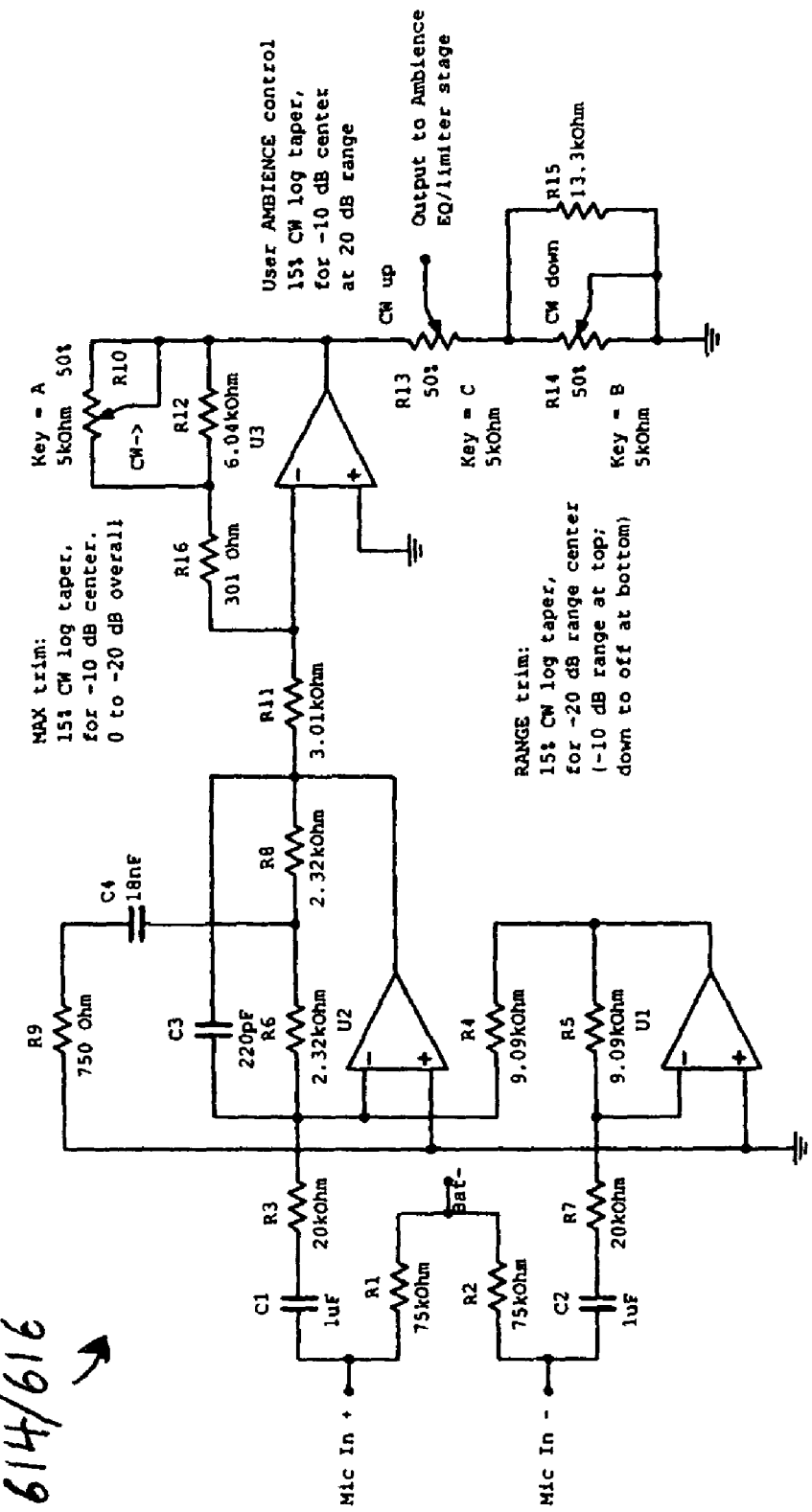
FIG. 8 is a detailed schematic of one of the microphone input stages of FIG. 6 wherein the right and left microphone input stages are substantially identical.

FIG. 8 is a schematic diagram of one of the microphone input stages 614/616 of FIG. 6, wherein the left and right microphone input stages of FIG. 6 are substantially identical. Resistors R1 and R2 balance the microphone power supply currents around battery—to center the associated microphone preamplifier within the associated high voltage supplies. The differential input stage made up of U1, U2 and associated components attenuates the input signal to keep peak signal levels within the 9 volt supply range and provides the high frequency boost that compensates the high frequency roll off of microphone 426 and its associated tubing 430. Op amps U1, U2, U3, and the op amps of subsequent figures unless otherwise noted may be type MC33178 from ON Semiconductor, Phoenix, Ariz. User ambience control R13 associated with user control 230 varies the ambience gain between a maximum, set by preset R10 and a minimum, set by preset R14 in conjunction with R10. Preset R10 sets the ambience maximum between 0 dB (unity, or the same as removing the ambience monitoring system) and −20 dB. Preset R14 sets the range below that maximum between 10 dB and infinite (to off).

Figure 9:
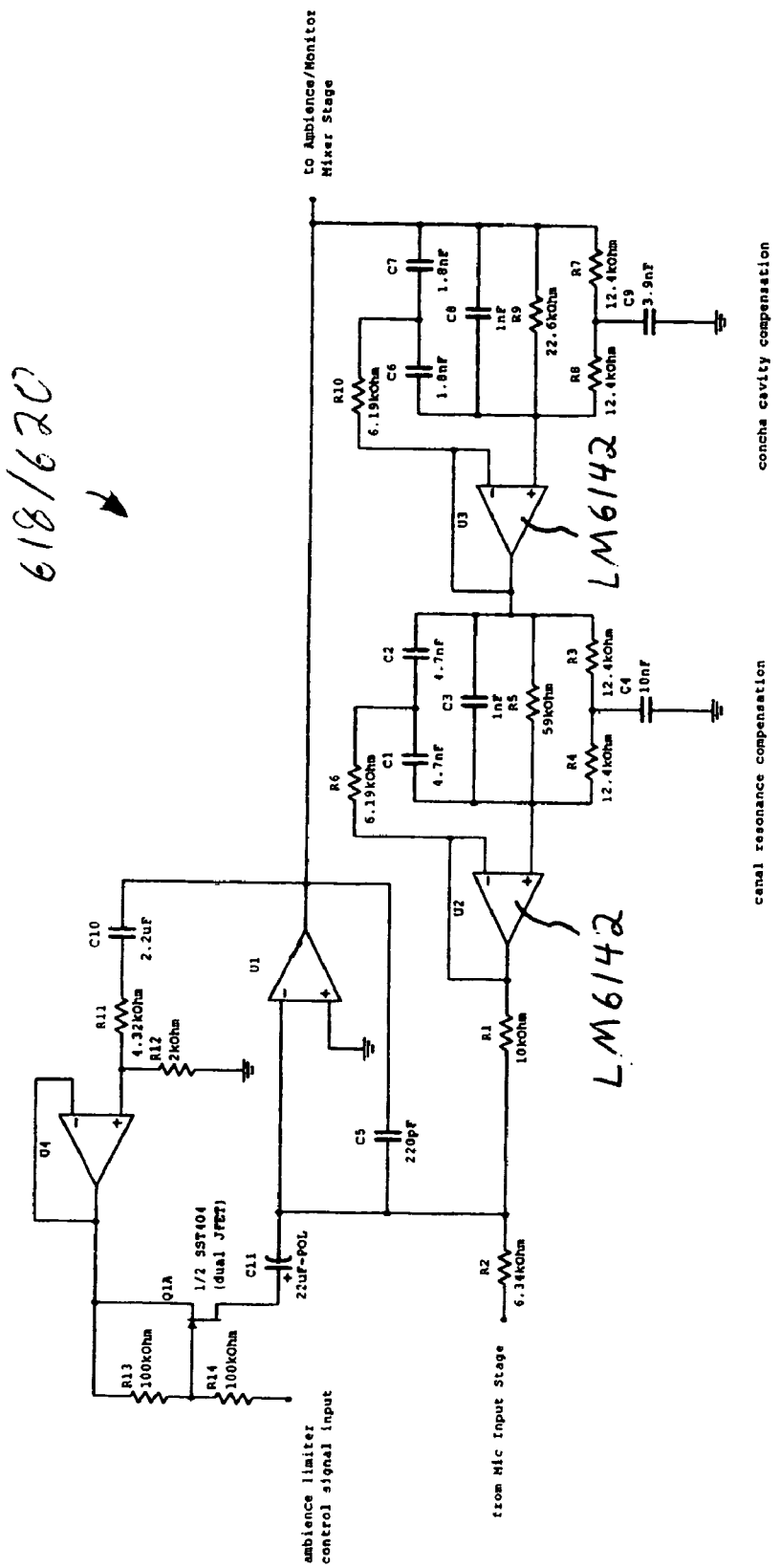
FIG. 9 is a schematic of one of the ambience EQ/Limiter stages of FIG. 6 wherein the right and left ambience EQ/Limiter stages are substantially identical.

FIG. 9 is a schematic diagram of one of the ambience EQ/Limiter stages 640/642 of FIG. 6, wherein the left and right ambience EQ/Limiter stages of FIG. 6 are substantially identical. Amplifiers U2 and U3 and associated components are located in the feedback path of amplifier U1, and provide inverse equalization curves. These become correct by the action of the feedback amplifier. The gain is reduced in response to the ambience limiter control signal applied to the ambience limiter control signal input from limiter control signal generator 622, through the reduced resistance of JFET Q1A, which is one-half of a matched pair. The other half simultaneously reduces the gain of the other (left or right) side. The action of the JFET Q1A, in effectively paralleling the equalization feedback stages, causes the gain at frequencies where the gain is the highest to be reduced first, causing an overall flattening of the overall stage frequency response. With further limiting, the gain at all frequencies is reduced, up to a maximum reduction of about 20 dB.

Figure 10:
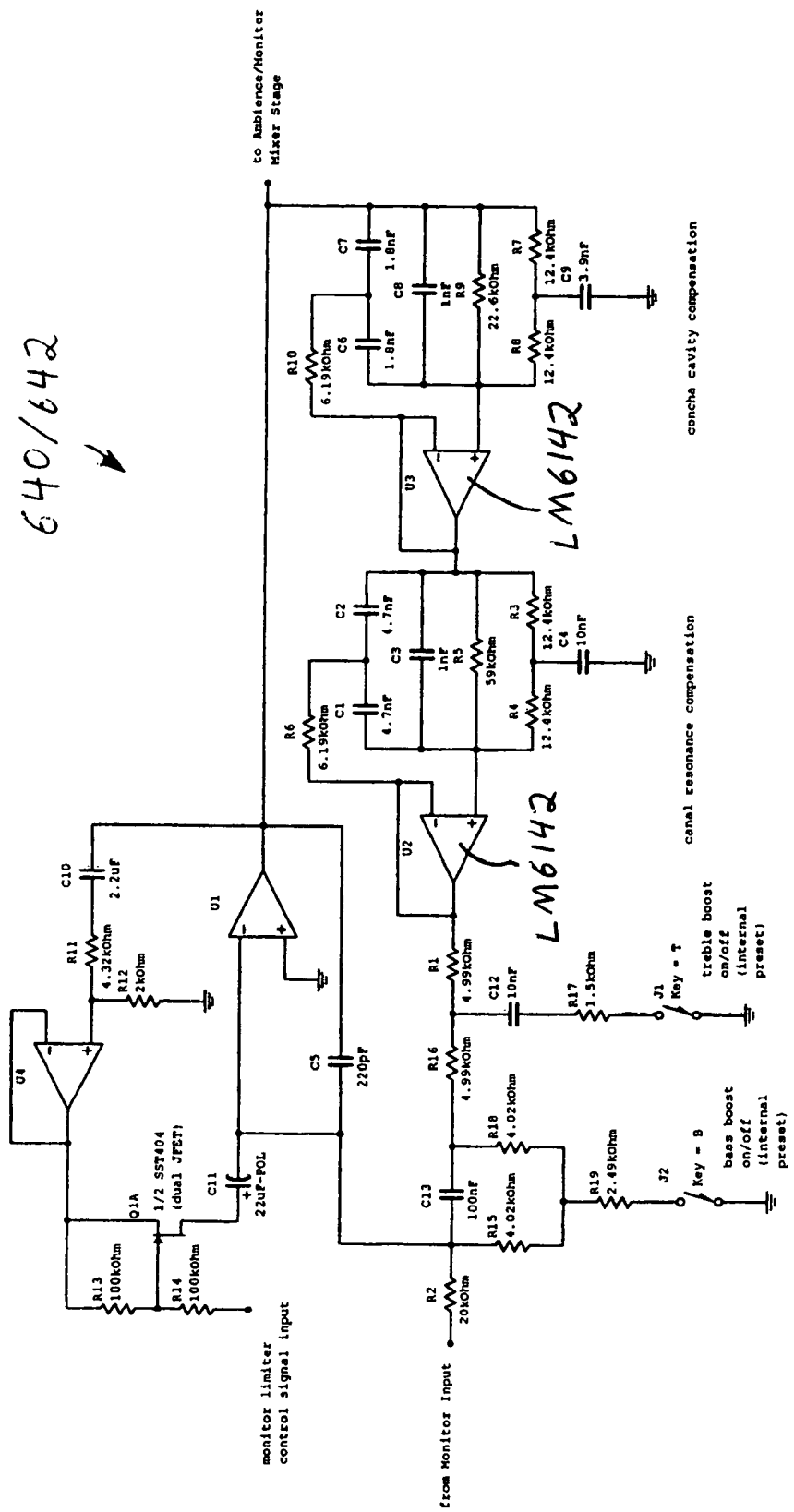
FIG. 10 is a schematic of one of the monitor EQ/Limiter stages of FIG. 6 wherein the right and left monitor EQ/Limiter stages are substantially identical.

FIG. 10 is a similar schematic diagram of the monitor EQ/Limiter stages 640/642 of FIG. 6, wherein the left and right monitor EQ/Limiter stages of FIG. 6 are substantially identical. Its behavior is identical to that just described for the corresponding ambience path stage, except that limiting is controlled by the monitor limiter control signal and there is some additional boosting of the lower frequencies, along with user presets switches, allowing further bass or treble boost.

Figure 11:
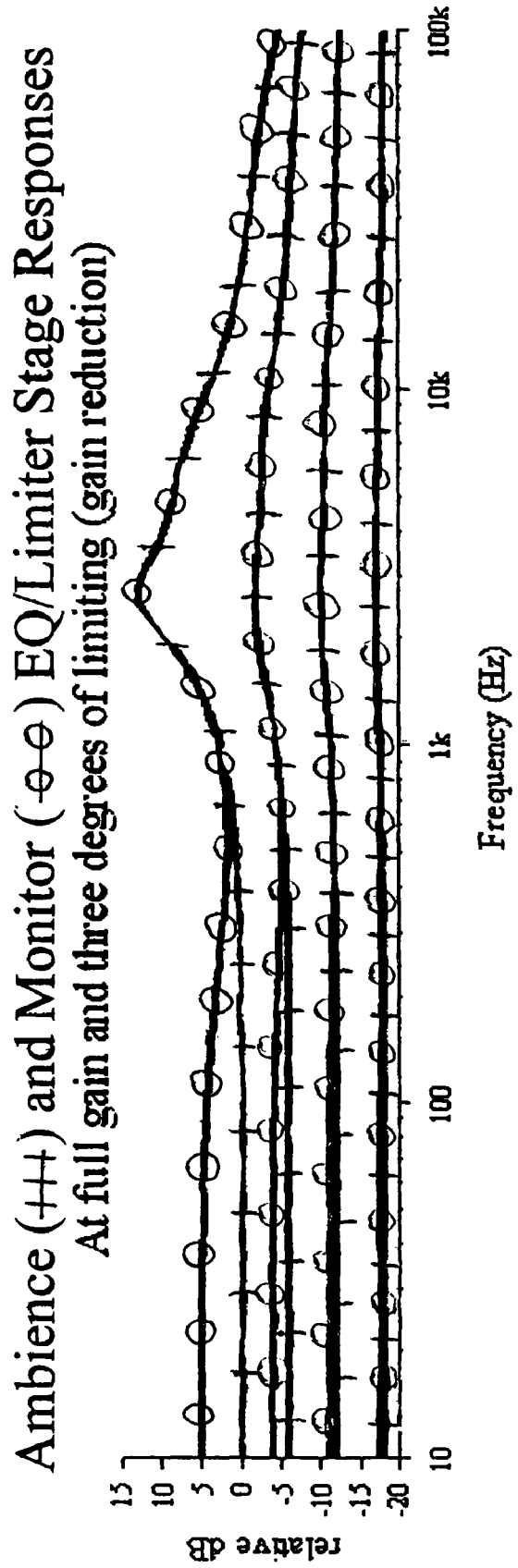
FIG. 11 is a graphical representation of the frequency responses of the circuitry of FIGS. 9 and 10.

The frequency responses of the circuitry of FIGS. 9 and 10 are shown in FIG. 11, together with the responses at three degrees of limiting. The non-limited frequency responses are appropriate to provide the desired results, as discussed.

Figure 12:
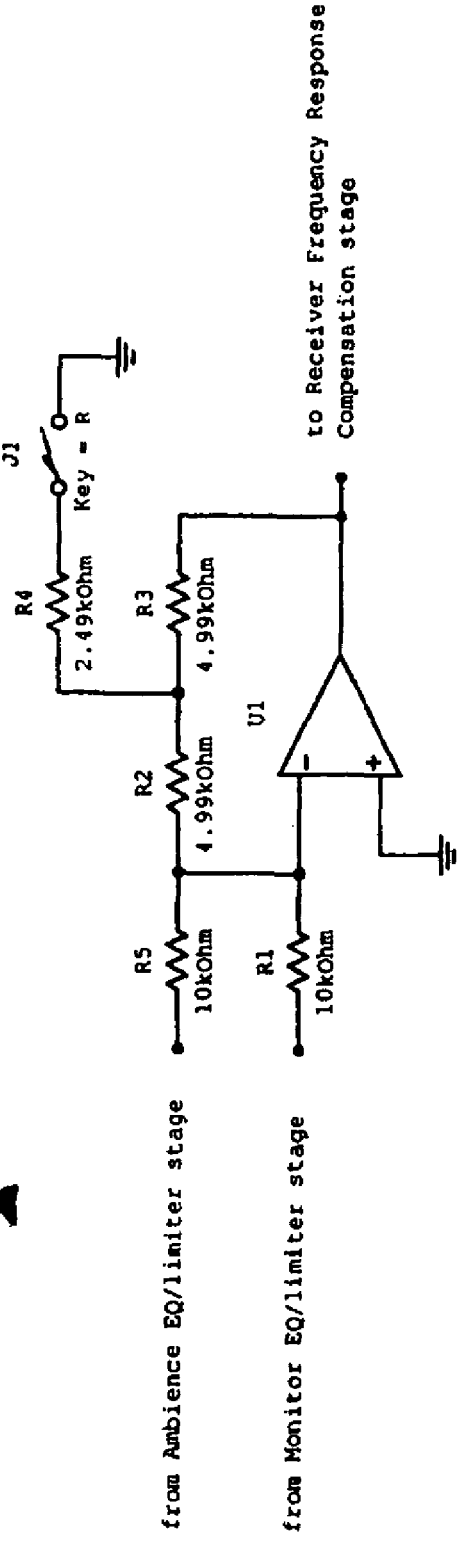
FIG. 12 is a schematic of one of the ambience/monitor mixer stages of FIG. 6 wherein the right and left ambience/monitor mixer stages are substantially identical.

FIG. 12 is a schematic diagram of the ambience/monitor mixer stages 624/626 of FIG. 6, wherein the left and right ambience/monitor mixer stages of FIG. 6 are substantially identical. As discussed, the gain is 0 dB when two receivers are used in the earphone, or preset to +6 dB when one receiver is used.

Figure 13:
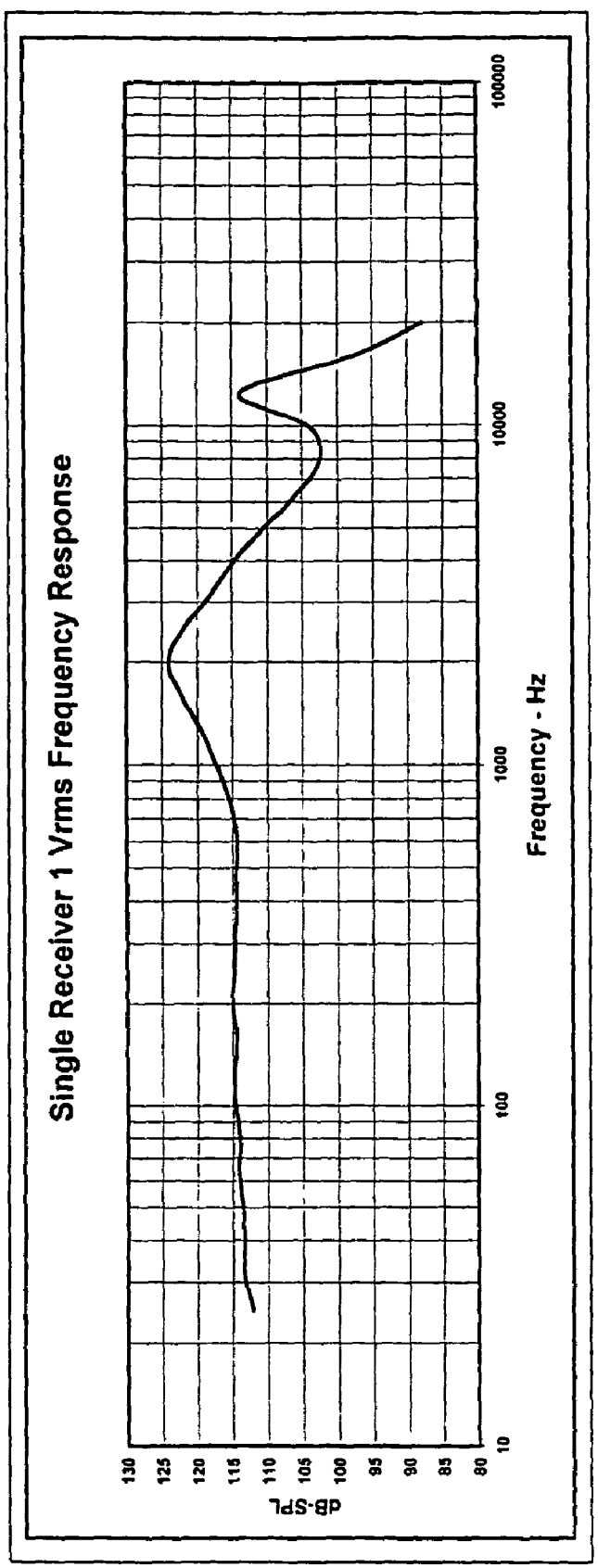
FIG. 13 is a graphical representation of the net electroacoustic frequency response of the receiver of FIG. 3 and its associated electroacoustic elements.

In an embodiment, the left and right receiver frequency response compensation can consists of one or more conventional stages that provide response compensation equal to the inverse of the measured receiver frequency response of FIG. 13.

Accordingly, FIG. 13 shows the response of a typical receiver 412 with its associated 120 Ohm resistor and 2200 Ohm acoustic damper, measured with 12 mm of tubing, loaded by an industry standard Zwislocki ear-simulating coupler. This response is compensated by receiver frequency response compensation blocks 628, 630.

In an embodiment, the left and right differential output stages can include an ultrasonic low pass filter to limit the transmission of out-of-band noise. Further, series 10 Ohm output resistors can be used to provide some protection for the output amplifiers and isolation from capacitive loading. Their resistance works in conjunction with resistors 512 in the earphones to provide the desired total series receiver resistance. The op amps of these stages can be of type LM8272 (National Semiconductor).

Turning back to FIG. 6, limiter control signal generation block 622 provides for two kinds of limiting. Fast response peak limiting is employed to prevent peak levels from exceeding the excursion limits of the receivers. These peak levels are sensed at the outputs of left and right differential output stages 632,634. This sensing information is channeled to the appropriate ambience or monitor control signal generation stages using information obtained from sensing the relative levels of the two paths at the output of their respective EQ/Limiter stages, before mixing. This peak limiting is performed with attack times of about 2 msec and release times of about 10 msec, allowing most sounds to remain unaffected. Peak limit indicator LEDs are shown on panel 282 (FIG. 2c) that, in an embodiment, flash when peak limiting occurs. The appropriate ambience or monitor peak LED flashes corresponding to the audio input or inputs that produced the excessive peak levels and is or are therefore undergoing peak limiting. In an embodiment, the peak limiter LED drive circuitry extends the LED drive for about 50 msec longer than the actual brief peak limiting action, to ensure visibility.

The second limiting action responds to the average estimated sound level at the user's eardrum, as measured at the outputs of the EQ/Limiter stages. Independently for the ambience and monitor paths, the average signal level of each channel of both paths is measured, after high-pass filtering that approximates A-weighting in the low frequencies. The maximum level predicted for either the left or right ear is determined for each of the ambience and monitor paths, and a corresponding limiter signal generated for each path if the level exceeds a threshold. The limiting action is preferably slow, with averaging according to a time constant of about 200 msec, so as to limit excessive average levels without materially affecting short-term transients. The limiting threshold corresponds to a specific approximate A-weighted sound pressure level estimation at the user's eardrum. By reference to established standards for occupational noise exposure, this sound pressure level may be equated to maximum safe exposure times. The threshold corresponds to A-weighted sound pressure levels between 90 and 110 dB-SPL.

Turning back to FIG. 2c, panel 280 shows a user control for turning this average limiting action on and off. In another embodiment, panel 280 could also include controls to vary the limiting threshold of this average limiting action, to enable the user to select a presumably safe threshold for an anticipated exposure time. Average limiting indicator LEDs are shown on panel 282 that flash when average limiting occurs. The appropriate ambience or monitor average LED flashes corresponding to the audio input or inputs that produced the excessive average levels and is or are therefore undergoing average limiting. If the average limiting is turned off by the action of the user control panel 280, the average limiting LEDs of panel 282 still flash when excessive levels are produced, thus becoming indicators of excessive average levels, but not of actual limiting action.

Figure 14:
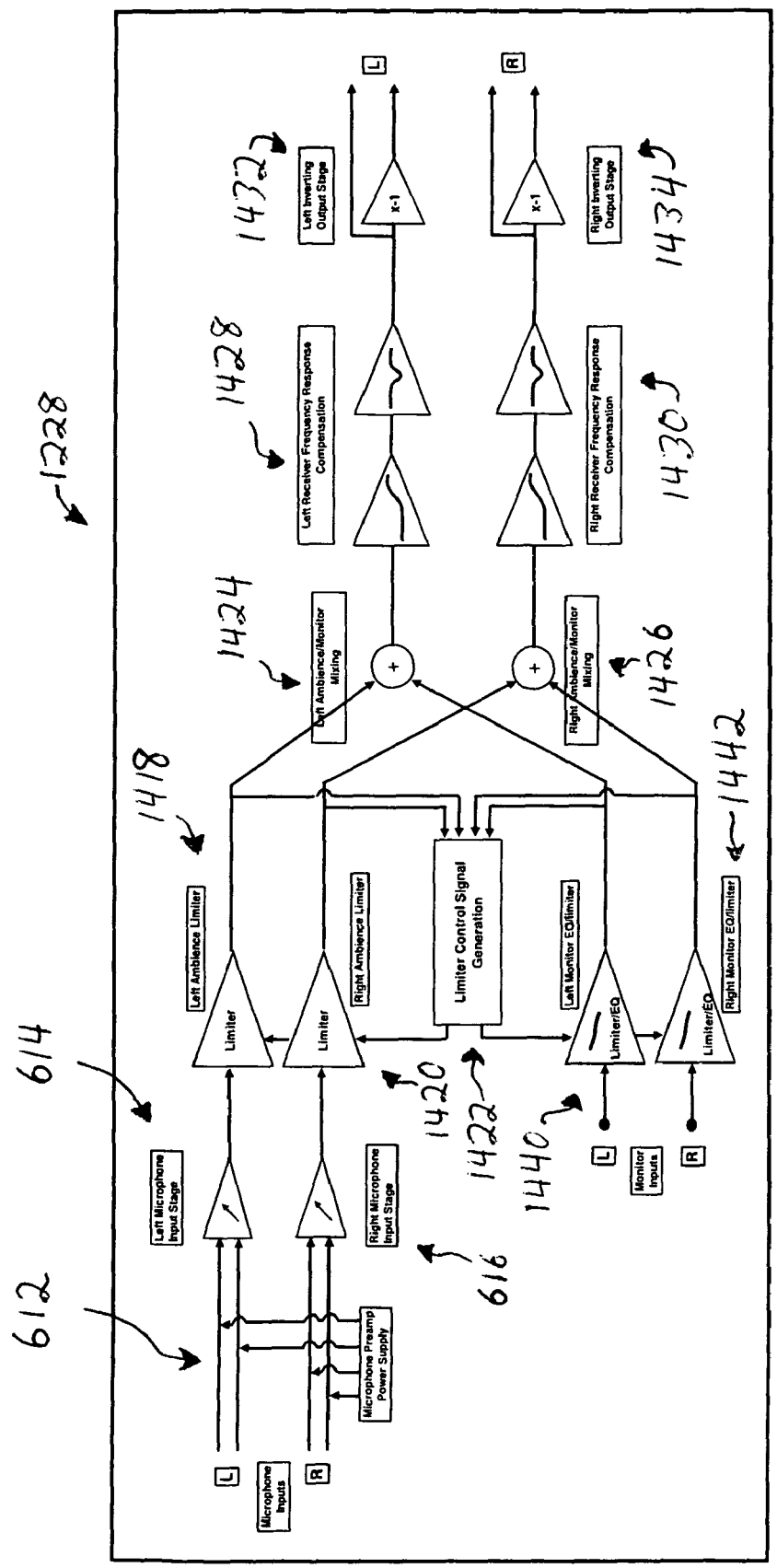
FIG. 14 is a schematic diagram of an alternate embodiment of the ambient body pack of FIG. 2b.

An alternative embodiment, with some variations from the just-described embodiments is depicted schematically in FIG. 14. One variation is that the high frequency microphone equalization described in connection with FIG. 6 is reduced or removed from the microphone input stages. This results in a modest net response rolloff above roughly 5 kHz, reaching roughly −5 dB relative to 1 kHz at 10 kHz. De-emphasizing the higher frequencies results in a more natural user experience, since accurate head diffraction-induced directional effects cannot be precisely maintained at those frequencies.

Also illustrated in FIG. 14 is a simpler method of obtaining the correct eardrum pressure frequency response through a more modest modification of the inherent receiver frequency response, simplifying both the receiver frequency response compensation circuitry and the ambience and monitor EQ/limiter stage circuitry.

Figure 15:
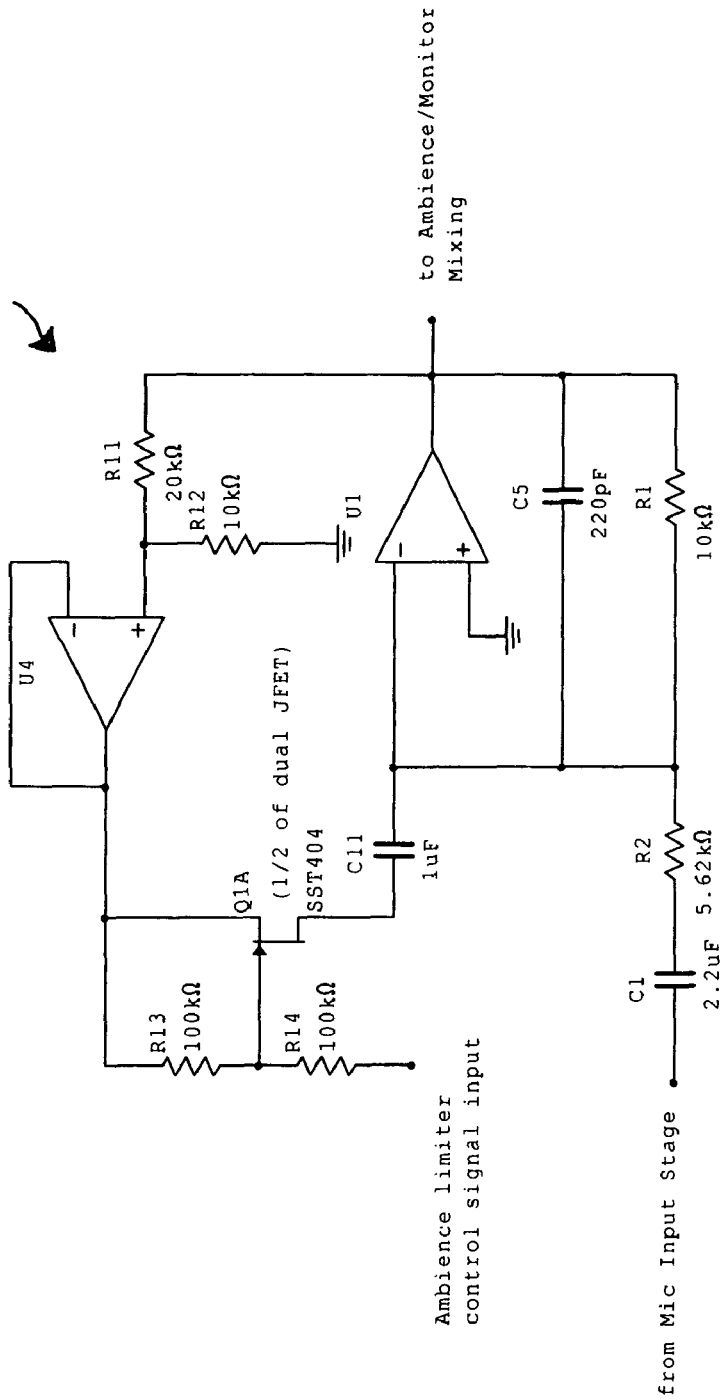
FIG. 15 is a schematic diagram of one of the ambience limiter stages of FIG. 14 wherein the right and left ambience limiter stages are substantially identical.
Figure 16:
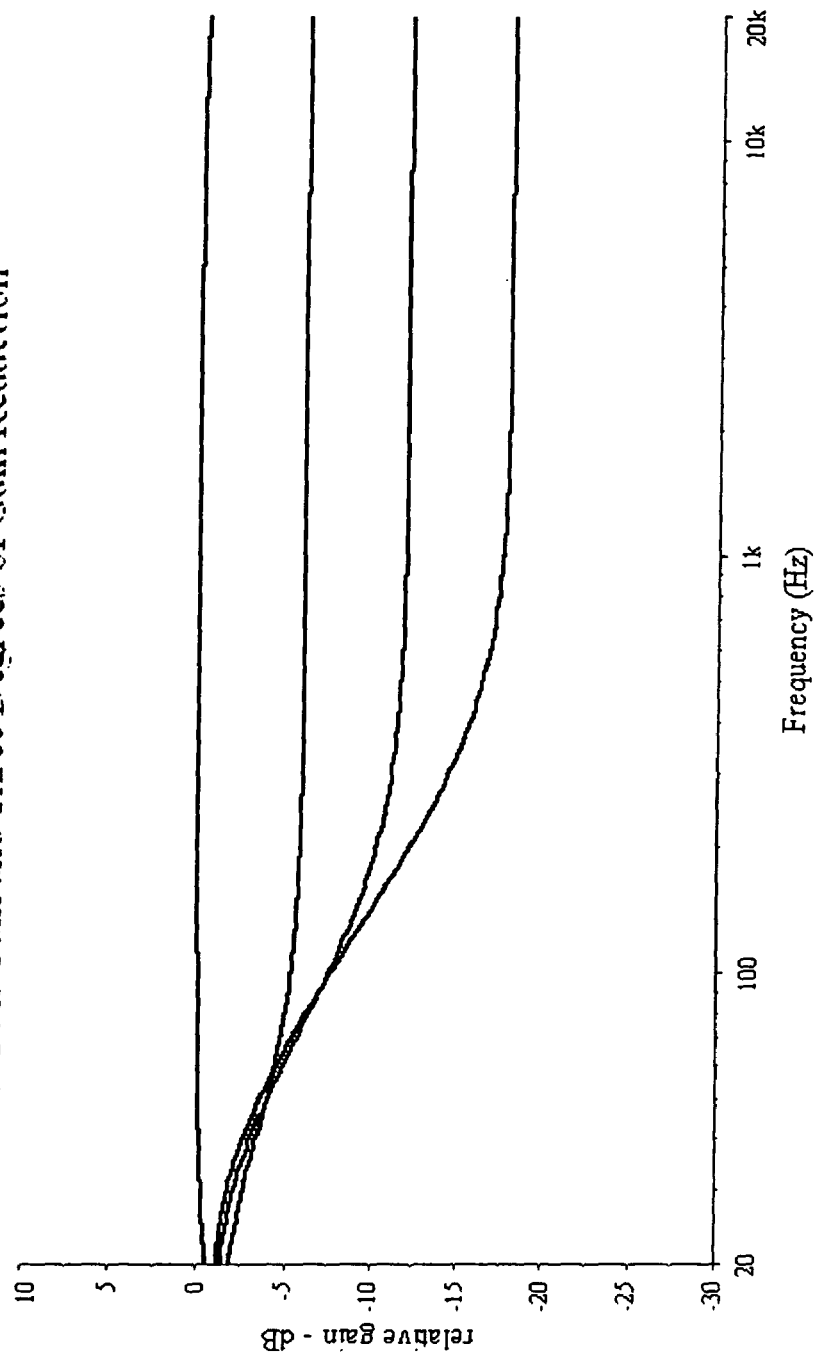
FIG. 16 is a graphical representation of frequency responses of the circuitry of FIG. 15.

FIG. 15 shows a schematic diagram of one of the ambience limiter stages 1418/1420 of FIG. 14 wherein the left and right ambience limiter stages are substantially identical. The frequency equalization components of the related circuitry of the previous embodiment shown in FIG. 9 are not present. The frequency response without limiting applied is essentially flat throughout the audio frequency range, as shown by the top curve of FIG. 16. Also shown in FIG. 16 are the frequency responses at several states of limiting-induced gain reduction. In contrast to the related curves of FIG. 11 of the previous embodiment, the lower frequencies are not reduced in gain as much as the mid and higher frequencies. This action is achieved primarily through a reduction in the size of C11 to 1 uF. In practice, the lower frequencies do not need to be limited as much as the mid and higher frequencies to maintain ear safety. Limiting them less reduces the audibility of the limiting action and reduces resultant user objections.

Figure 17:
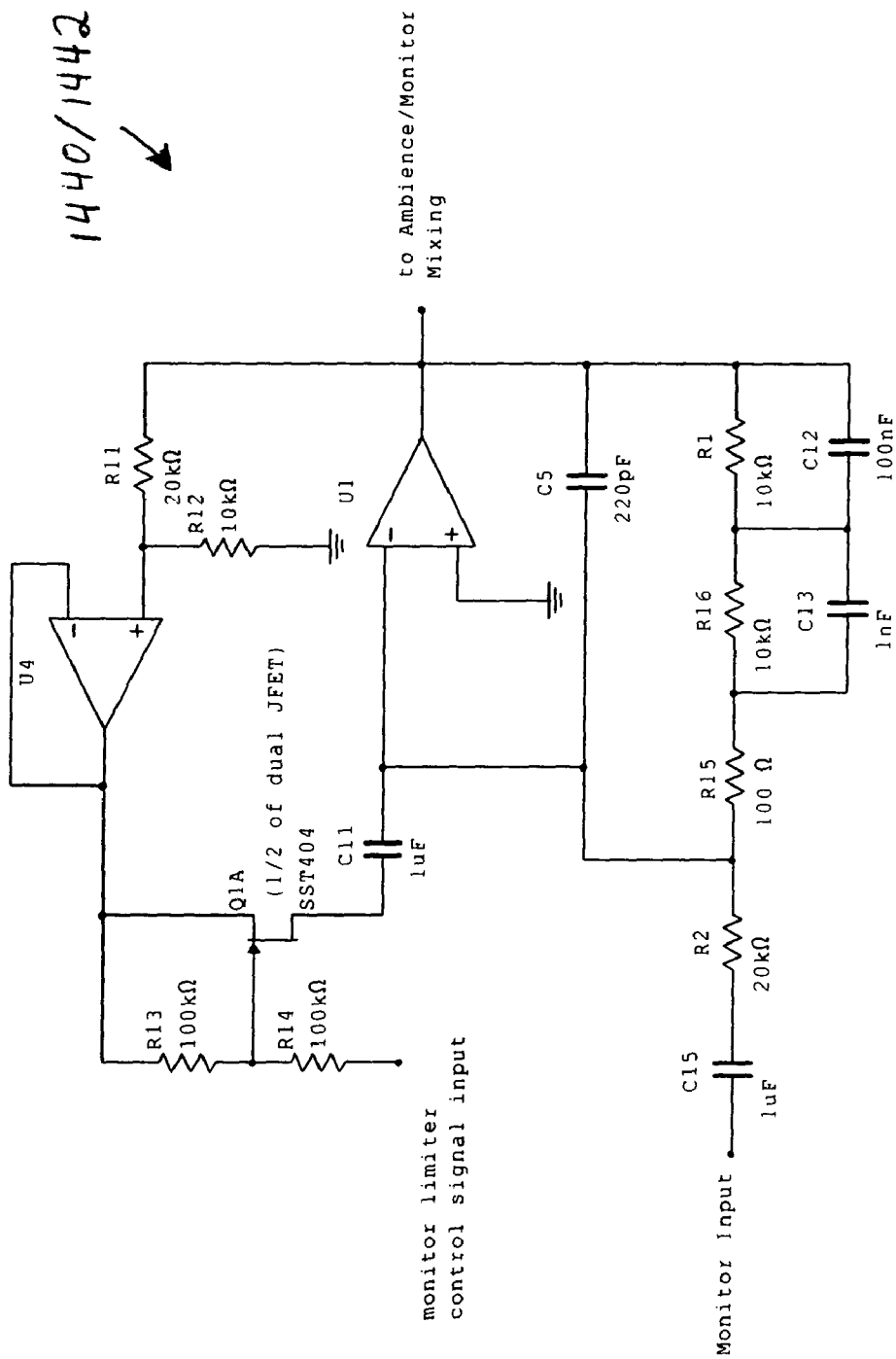
FIG. 17 is a schematic diagram of one of the monitor EQ/limiter stages of FIG. 14 wherein the right and left monitor EQ/limiter stages are substantially identical.

FIG. 17 shows a schematic diagram of one of the monitor EQ/limiter stages of FIG. 14 wherein the left and right monitor EQ/limiter stages are substantially identical. The circuitry of this stage is similar to the ambience limiter circuitry of FIG. 15, except that some fixed frequency equalization is applied by R1, 15 and 16, and C12 and 13. In the absence of limiting action, this results in the sloped response given by the top curve of FIG. 18. Modifying the theoretically accurate response by this curve results in a subjectively preferable response for the majority of users in typical monitoring situations. The application of limiting results in the lower response curves shown.

Figure 18:
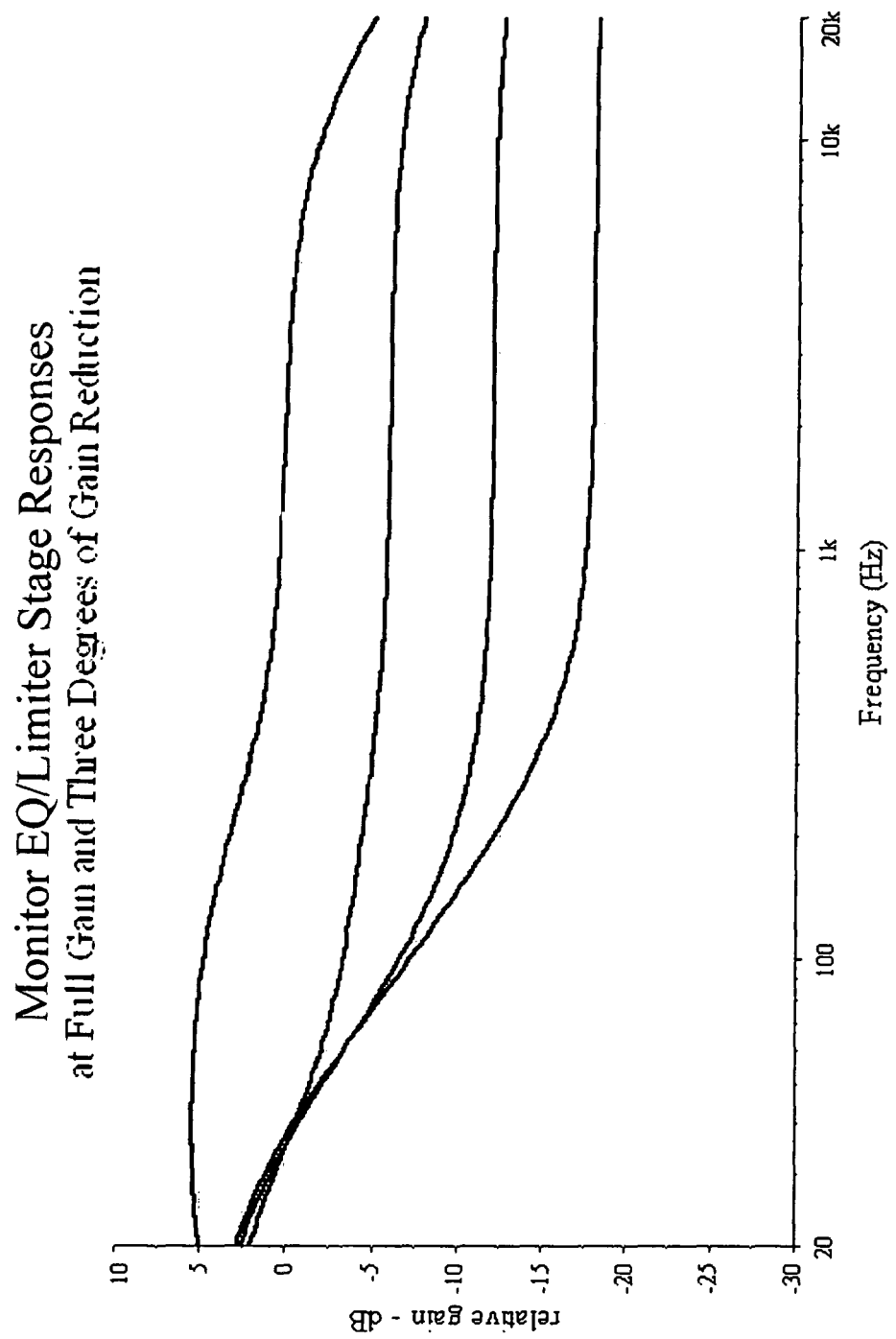
FIG. 18 is a graphical representation of frequency responses of the circuitry of FIG. 17.

An important additional action is enabled by the monitor limiting circuitry of this or the previous embodiment. As described in connection with FIG. 8, the ambience level may be varied preferably anywhere from full off to a full-on level equal to that experienced by the user with open ears. In an alternative embodiment to that shown in FIG. 8, a background level of ambience may be preset by the user, with the full-on level enabled by a separate switch. Modifying the circuitry of FIG. 8 to accomplish this action may be achieved by several methods evident to those of ordinary skill in the art. Experience has shown that even with the full-on ambience level activated, verbal communication can still be hampered by loud monitor signal levels. It is advantageous, therefore, that excessive monitor levels be reduced during activation of the full-on ambience condition. This is best accomplished not by introducing a fixed monitor signal attenuation at the time of full-on ambience activation, but rather by limiting the monitor level to, for example, roughly 85 dB-SPL A-weighted during that time. The monitor level will only be reduced by the amount necessary to enable verbal communication over it. This action can be accomplished by increasing the sensitivity of the monitor signal slow limiting action signal sensing, which sensing was previously described in connection with limiter control signal generation block 622 (FIG. 6), during activation of full-on ambience. The limiting action frequency responses shown in FIG. 18 are advantageous during this full-on ambience mode of operation in minimizing the attenuation of low frequencies that do not hinder verbal communication.

Figure 19:
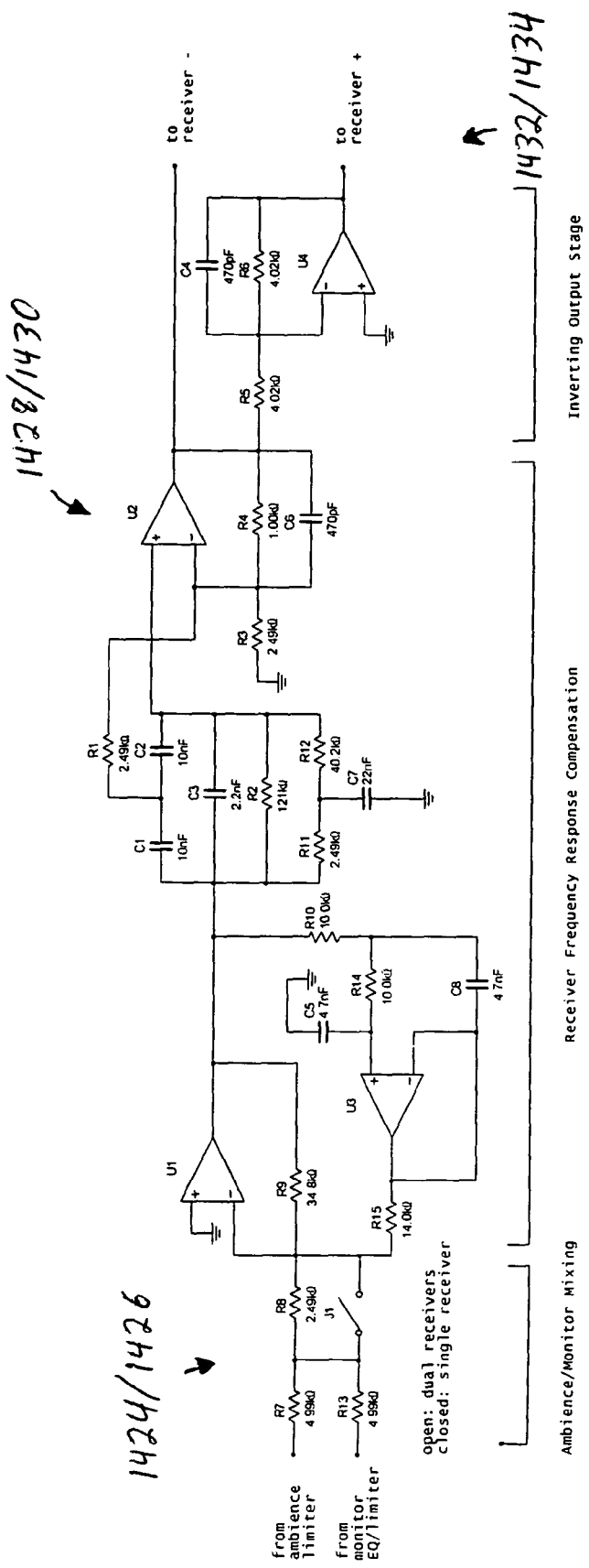
FIG. 19 is a schematic diagram of one of the two substantially identical channels of the ambience/monitor mixing, receiver frequency response compensation, and inverting output stage blocks of FIG. 14; and, FIG. 20 is a graphical representation of the net electroacoustic frequency response of the receiver of FIG. 3, the receiver equalization provided by the circuitry of FIG. 19, and the net equalized receiver electroacoustic frequency response.

Circuitry of the remainder of one of the two substantially identical channels of FIG. 14 is shown schematically in FIG. 19. Switch J1 increases the gain by 6 dB when closed to compensate for the sensitivity loss when using one receiver in each earpiece instead of paired receivers. Receiver frequency response equalization to compensate for the loss of the ear canal resonance and the receiver high frequency rolloff is provided by U1, U3, U2, and associated circuitry. In contrast to the previous embodiment, most of the desired canal resonance compensation mid frequency boost is provided by the inherent primary resonance of the receiver. A mild frequency response dip centered at 1.55 kHz is provided by U2 and associated input resistor and capacitors. This serves to re-shape the receiver peak and move it slightly higher in frequency to the proper position in the audio frequency spectrum. U1, U3, and associated components provide the needed high frequency boost to compensate the receiver rolloff, without excessively boosting an undesired high frequency receiver resonance.

Figure 20:
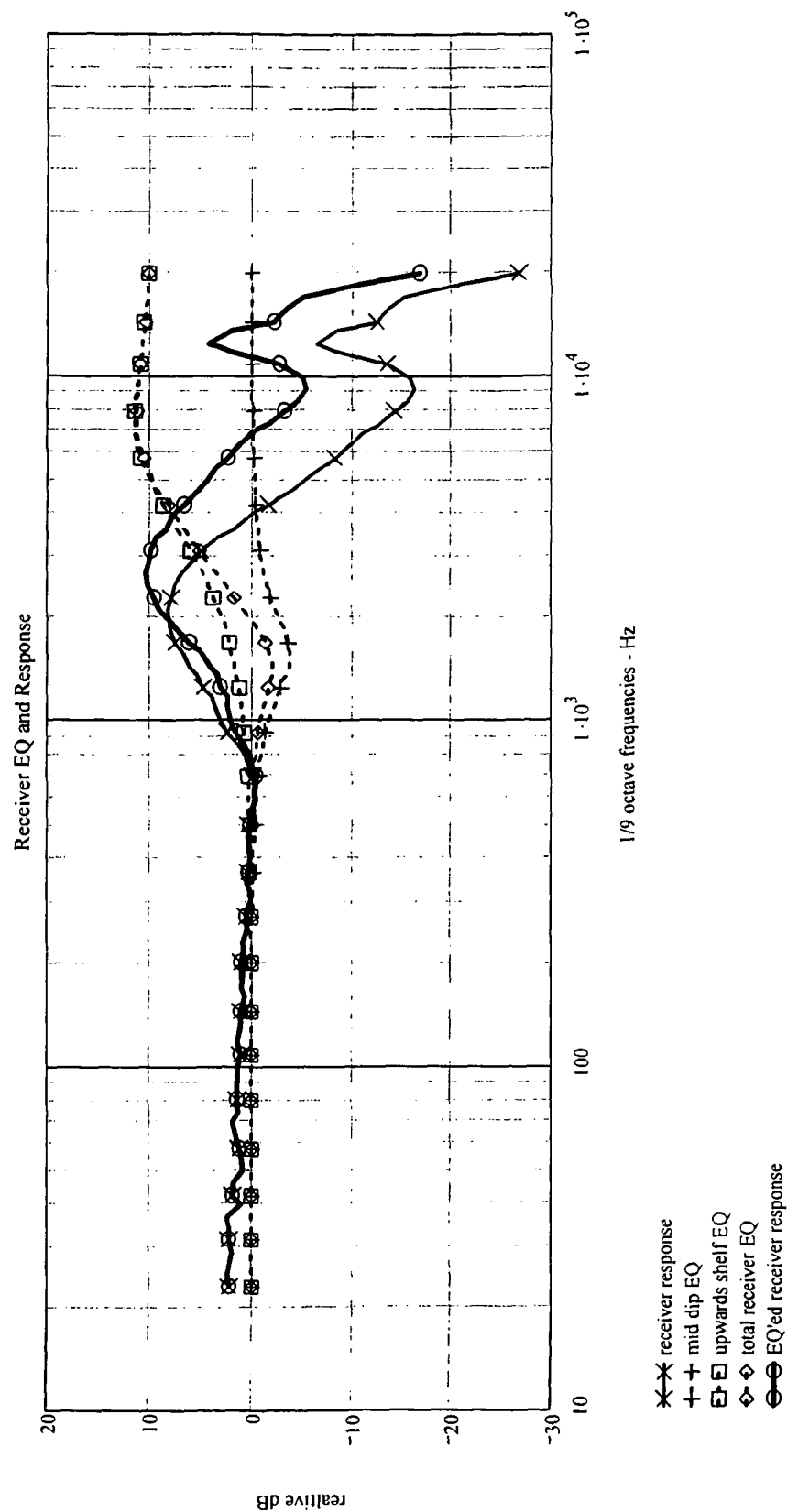

FIG. 20 shows the receiver response into a Zwislocki coupler when driven through a total of 150 Ohms resistance, the mid-dip and high frequency boost equalization provided by the circuitry of FIG. 19, and the resultant equalized receiver response.

It should be emphasized that the above-described embodiments of the present invention, particularly, and "preferred" embodiments, are possible examples of implementations merely set forth for a clear understanding of the principles of the invention. Many variations and modifications may be made to the above-described embodiment(s) of the invention without substantially departing from the spirit and principles of the invention. All such modifications are intended to be included herein within the scope of this disclosure and the present invention, and protected by the following claims.

What is claimed is:

1. An audio monitoring system for providing audible sound to a person, the audio monitoring system comprising:
at least one earphone for coupling sound to an ear of a person, the at least one earphone sized to at least partially fit within an ear canal and having at least one attached microphone located about an opening to the ear canal with an output responsive to sound as received by the ear of the person in normal listening, the at least one earphone having a preamplifier configured for receiving microphone output levels of about 14 volts peak or greater;

at least one receiver within the at least one earphone; and, an amplifier incorporating electrical equalization that couples the at least one microphone output to the at least one receiver so that the combination of the amplifier with the at least one receiver and the at least one microphone mimics the tonal balance heard through the full frequency range of human hearing by the person with no earphone in place, and wherein said amplifier and said at least one microphone provide maximum sound pressure levels received by the person in normal listening in excess of 120 dB-SPL.

2. The audio monitoring system of claim 1 further comprising an electrical means of coupling an additional audio signal into the amplifier and a means of controlling the perceived balance between the audio signal and the output from the microphone.

3. An apparatus for providing a mixture of ambient and monitored audible sound within a right and left ear canal of a user comprising:

a left earphone comprising a microphone and sized to at least partially fit within the left ear canal, the left microphone being positioned about an opening to the left ear canal and providing a left electrical output in response to the ambient sound as received by the left ear of the user;

a right earphone comprising a microphone and sized to at least partially fit within the right ear canal, the microphone being positioned about an opening to the right ear canal and providing a right electrical output in response to the ambient sound as received by the right ear of the user;

electronic circuitry comprising a left mixed output responsive to the left electrical output and the monitored audible sound, and a right mixed output responsive to the right electrical output;

a left receiver within the left earphone and responsive to the left mixed output;

a right receiver within the right earphone and responsive to the right mixed output; and, an amplifier incorporating electrical equalization that couples the microphone outputs to the receivers so that the combination of the amplifier with the receivers and the microphones mimics the tonal balance heard through the full frequency range of human hearing by the user with no earphone in place, and wherein the amplifier and the left and right microphones provide maximum sound pressure levels received by the user in normal listening in excess of 120 dB-SPL.

4. The apparatus of claim 3, further comprising a user control, wherein the responsiveness of the electronic circuitry to the microphone left and right electrical outputs can be simultaneously varied.

5. The apparatus of claim 3, the electronic circuitry comprising a jack to receive the monitored audible sound from an external source.

6. The apparatus of claim 3, wherein the electronic circuitry is contained in a package that can be removably attached to the user.

7. The apparatus of claim 3, wherein each earphone has a second receiver.

8. The apparatus of claim 7, wherein a separate tube extends from each receiver to the ear canal.

9. A method for providing a mixture of ambient and monitored audible sound within a right and left ear canal of a user, the method comprising the steps of:

at least partially placing a left earphone within the left ear canal, the left earphone comprising a microphone positioned about an opening to the left ear canal and providing a left electrical output in response to the ambient sound as received by the left ear of the user;

at least partially placing a right earphone within the right ear canal, the right earphone comprising a microphone positioned about an opening to the right ear canal and providing a right electrical output in response to the ambient sound as received by the right ear of the user;

generating a left mixed output responsive to the left electrical output and the monitored audible sound, and a right mixed output responsive to the right electrical output and the monitored audible sound;

equalizing the microphone electrical outputs to mimic tonal balance heard through the full frequency range of human hearing with no earphone in place;

providing maximum sound pressure levels received by the user in normal listening in excess of 120 dB-SPL; and, simultaneously varying the left and right microphone electrical outputs.

10. An apparatus for providing a mixture of ambient and monitored audible sound within an ear canal, the apparatus comprising:

an earphone comprising a microphone and sized to at least partially fit within the ear canal, the microphone being positioned about an opening to the ear canal and providing an electrical output in response to the ambient sound as received by the ear;

electronic circuitry generating a mixed output responsive to the microphone electrical output and the monitored audible sound;

a single receiver within the earphone and responsive to the mixed output;

an amplifier incorporating electrical equalization that couples the microphone output to the receiver so that the combination of the amplifier with the receiver and the microphone mimics the tonal balance heard through the full frequency range of human hearing by the user with no earphone in place, and wherein the amplifier and the microphone provides maximum sound pressure levels received by the user in normal listening in excess of 120 dB-SPL; and a user control wherein the responsiveness of the electronic circuitry to the microphone electrical output can be varied.

11. The apparatus of claim 10 wherein the receiver is provided with a series resistor.

12. The apparatus of claim 11 wherein the receiver and series resistor are driven by a differential output stage.

13. The apparatus of claim 10 wherein the earphone includes a microphone preamplifier for receiving the microphone electrical output and producing a microphone preamplifier output.

14. The apparatus of claim 10 further comprising another receiver within the earphone and responsive to the mixed output.

15. The apparatus of claim 13 wherein the microphone preamplifier output is provided to the electronic circuitry via an unshielded cable.

16. The apparatus of claim 13 wherein the microphone preamplifier output is differential.

17. The apparatus of claim 13 wherein the microphone preamplifier is configured for handling without overload microphone output levels of about 14 volts peak or greater.

18. An apparatus providing a mixture of ambient and monitored audible sound within a right and left ear canal, the apparatus comprising:
- a left earphone comprising a microphone and sized to at least partially fit within the left ear canal, the left microphone being positioned about an opening to the left ear canal and providing a left electrical output in response to the ambient sound as received by the left ear;
- a right earphone comprising a microphone and sized to at least partially fit within the right ear canal, the right microphone being positioned about an opening to the right ear canal and providing a right electrical output in response to the ambient sound as received by the right ear;
- a left microphone preamplifier located within said left earphone;
- a right microphone preamplifier located within said right earphone;
- electronic circuitry generating a mixed output responsive to the microphone electrical output and the monitored audible sound; and
- an amplifier incorporating electrical equalization that couples the microphone outputs to the preamplifiers such that the resultant sound heard by the user mimics the tonal balance heard through the full frequency range of human hearing with no earphone in place;
- wherein said microphones and microphone preamplifiers are configured for undistorted conversion to corresponding electrical signals sound pressure levels in excess of 120dB-SPL.

19. The apparatus of claim 18 wherein the sound pressure levels are in excess of 130 dB-SPL.

20. The apparatus of claim 19 wherein the sound pressure levels are in excess of 140 dB-SPL.

21. The apparatus of claim 18 wherein the microphone preamplifiers provide a differential output signal with a low output impedance.

22. The apparatus of claim 21 wherein the output impedance is about 5 Ohms.

23. The apparatus of claim 21 wherein the microphone preamplifiers output signals connect to differential input amplifiers.

24. The apparatus of claim 18 wherein the microphone preamplifiers receive operating power along two wires from a total supply voltage greater than the power supply voltage of the electronic circuitry.

25. The apparatus of claim 24 wherein the total supply voltage is about 25 volts or greater.

26. The apparatus of claim 24 wherein the operating power is supplied at substantially constant current.

27. The apparatus of claim 26 wherein the current is about 1 mA for each preamplifier.

28. An apparatus for providing ambient audible sound within a right and left ear canal of a user, the apparatus comprising:
- a left earphone comprising a microphone and sized to at least partially fit within the left ear canal, the left microphone being positioned about an opening to the left ear canal and providing a left electrical output in response to the ambient sound as received by the left ear of the user;
- a right earphone comprising a microphone and sized to at least partially fit within the right ear canal, the right microphone being positioned about an opening to the right ear canal and providing a right electrical output in response to the ambient sound as received by the right ear;
- a left microphone preamplifier located within said left earphone having a left microphone preamplifier gain;
- a right microphone preamplifier located within said right earphone having a right microphone preamplifier gain; and
- an amplifier incorporating electrical equalization that couples the microphone outputs to the preamplifiers such that the resultant sound heard by the user mimics the tonal balance heard through the full frequency range of human hearing with no earphone in place, and wherein the amplifier and the left and right microphones provide maximum sound pressure levels received by the user in normal listening in excess of 120 dB-SPL;
- wherein said gains are presettable to compensate for variations in the sensitivity of their associated microphones.

29. An apparatus for providing ambient or monitored audible sound within a right and left ear canal of a user, the apparatus comprising:
- left and right earphones sized to at least partially fit within the left and right ear canals and each of said earphones comprising at least one microphone positioned about an opening to the left and right ear canal, respectively, and providing an output responsive to sound as received by the ears of the user;
- left and right receivers located within the left and right earphones for producing sound in the left and right ear canals responsive to the output of the at least one microphone;
- left and right series resistors wired electrically in series with said left and right receivers and located within the left and right earphones; and
- an amplifier incorporating electrical equalization that couples the output of the at least one microphone to the left and right receivers such that the resultant sound heard by the user mimics the tonal balance heard through the full frequency range of human hearing with no earphone in place, and wherein the amplifier and the left and right microphones provide maximum sound pressure levels received by the user in normal listening in excess of 120 dB-SPL;
- wherein said resistors are presettable to compensate for variation in the sensitivity of said receivers.

30. An apparatus for providing a mixture of ambient and monitored audible sounds within a right and left ear canal of a user, the apparatus comprising:
- a left earphone comprising a microphone and sized to at least partially fit within the left ear canal, the left microphone being positioned about an opening to the left ear canal and providing a left electrical output in response to the ambient sound as received by the left ear of the user;
- a right earphone comprising a microphone and sized to at least partially fit within the right ear canal, the right microphone being positioned about an opening to the right ear canal and providing a right electrical output in response to the ambient sound as received by the right ear of the user;
- left and right receivers for producing sound in the left and right ear canals and responsive to the outputs of the left and right microphones, respectively;
- ambient equalizer to compensate for differences in response to the ambient sounds as responded to by the left or right earphone microphone and the response near the eardrum of a left or right open ear of the user; and,
- receiver equalizer to compensate for the response of the left or right receiver, and wherein the compensation mimics the tonal balance heard through the full frequency range of human hearing by the user with no earphone in place and the left and right microphones and their associated amplifier circuitry provide maximum sound pressure levels received by the microphones in normal listening in excess of 120 dB-SPL.

31. The apparatus of claim 30 wherein the left and right receivers are operated together with second left and right receivers, the left and right receivers and the second left and right receivers all producing the full frequency range of human hearing.

32. The apparatus of claim 31 wherein said first and second left and right receivers each feed their respective ear canals through separate acoustic output tube outlets from their respective earphone assemblies.

33. An apparatus for providing monitored audible sound within a right and left ear canal of a user, the apparatus comprising:
- at least one left and at least one right receiver for producing sound in the left and right ear canals wherein the receivers are mounted to earphones sized to at least partially fit within the ear canals and comprising at least one microphone positioned about an opening to the ear canal and providing an output responsive to sound as received by the ears of the user; and
- amplification circuitry having a gain to receive left and right output signals from the corresponding microphones and apply amplified versions to said at least one left and at least one right receiver, wherein the amplified versions mimic the tonal balance heard through the full frequency range of human hearing by the user with no earphone in place and the at least one microphone and the amplification circuitry provides maximum sound pressure levels received by the at least one microphone in normal listening in excess of 120 dB-SPL;
- wherein said gain is settable to compensate for a number of said left and right receivers employed to maintain substantially constant electroacoustic gain, substantially independent of the number of said receivers employed.

34. An apparatus for providing ambient audible sound within a right and left ear canal of a user, the apparatus comprising:
- a left earphone comprising a microphone and sized to at least partially fit within the left ear canal, the left microphone being positioned about an opening to the left ear canal and providing a left electrical output in response to the ambient sound as received by the left ear of the user;
- a right earphone comprising a microphone and sized to at least partially fit within the right ear canal, the right microphone being positioned about an opening to the right ear canal and providing a right electrical output in response to the ambient sound as received by the right ear of the user;
- at least one receiver within the earphone;
- an amplifier incorporating electrical equalization that couples the output of the left and right microphones to the at least one receiver so that the audible sound produced within the right and left ear canals of the user mimics the tonal balance heard through the full frequency range of human hearing by the user with no earphone in place, and wherein the amplifier and the left and right microphones provide the maximum sound pressure level received by the microphones in normal listening in excess of 120 dB-SPL; and
- left and right ambience limiter circuitry to reduce the amplifier gain in response to excessive signal levels.

35. The apparatus of claim 34 further comprising:
left and right receivers for producing sound in the left and right ear canals; and,
wherein said gain reduction occurs in response to peak signal levels predictive of excursion limits of said receivers.

36. The apparatus of claim 34 wherein the gain reduction occurs in response to average signal levels predictive of sound pressure levels occurring at a user's left and right eardrum of the user.

37. The apparatus of claim 36 wherein the average signal levels are predicative of A-weighted sound pressure levels occurring at a left and right eardrum of the user.

38. The apparatus of claim 36 wherein the gain reduction occurs when average signal levels exceed a threshold.

39. The apparatus of claim 38 wherein the threshold can be varied.

40. An apparatus for providing monitored audible sound within a right and left ear canal of a user, the apparatus comprising:
- a left earphone comprising a microphone and sized to at least partially fit within the left ear canal, the left microphone being positioned about an opening to the left ear canal and providing a left electrical output in response to the ambient sound as received by the left ear of the user;
- a right earphone comprising a microphone and sized to at least partially fit within the right ear canal, the microphone being positioned about an opening to the right ear canal and providing a right electrical output in response to the ambient sound as received by the right ear of the user;
- left and right receivers responsive to the outputs of the left and right microphones, respectively, for producing sound in the left and right ear canals and having a frequency response;
- receiver equalizer to compensate for the frequency response of the left and right receivers; and
- left and right monitor EQ/limiter circuitry to both compensate for a difference in the frequency response to monitored sounds as produced by the equalized left and right receivers at the eardrums of the user and a desired response, and to reduce its gain in response to excessive signal levels;
- wherein the microphone electrical outputs are equalized to mimic tonal balance heard through the full frequency range of human hearing with no earphone in place, the microphones and the circuitry provide maximum sound pressure levels received by the microphones in normal listening in excess of 120 dB-SPL and said gain is reduced more in the frequency ranges initially having the most monitor EQ/limiter circuitry gain.

41. The apparatus of claim 40 wherein the gain reduction occurs in response to peak signal levels predictive of excursion limits of said receivers.

42. The apparatus of claim 40 wherein the gain reduction occurs in response to average signal levels predictive of sound pressure levels occurring at the left and right eardrums.

43. The apparatus of claim 42 wherein the average signal levels are predictive of A-weighted sound pressure levels occurring at the left and right eardrums.

44. The apparatus of claim 42 wherein the gain reduction occurs when average signal levels exceed a threshold.

45. The apparatus of claim 44 wherein the threshold can be varied.

46. The apparatus of claim 44 wherein the threshold corresponds to A-weighted sound pressure levels between 90 and 110 dB-SPL.

47. The apparatus of claim 45 wherein the threshold is shifted when the user controls the level of the microphone outputs appearing in the sound in the left and right ear canals.

48. The apparatus of claim 47 wherein the threshold is reduced in conjunction with an increase by user control of the level of the microphone outputs appearing in the sound in the left and right ear canals.

49. The apparatus of claim 48 wherein the reduction in threshold is to a level corresponding to an average A-weighted SPL of 70 to 90 dB-SPL at the user's ear.

* * * * *